US012615452B2

(12) United States Patent
Sasago

(10) Patent No.: US 12,615,452 B2
(45) Date of Patent: Apr. 28, 2026

(54) PHOTOELECTRIC CONVERSION DEVICE, PHOTOELECTRIC CONVERSION SYSTEM, AND MOVING BODY

(71) Applicant: CANON KABUSHIKI KAISHA, Tokyo (JP)

(72) Inventor: Tomoya Sasago, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 104 days.

(21) Appl. No.: 18/638,064

(22) Filed: Apr. 17, 2024

(65) Prior Publication Data

US 2024/0267651 A1 Aug. 8, 2024

Related U.S. Application Data

(63) Continuation of application No. PCT/JP2022/037576, filed on Oct. 7, 2022.

(30) Foreign Application Priority Data

Oct. 20, 2021 (JP) ................................. 2021-171689

(51) Int. Cl.
*H04N 25/709* (2023.01)
*H04N 25/76* (2023.01)
*H10F 39/00* (2025.01)

(52) U.S. Cl.
CPC ........... *H04N 25/709* (2023.01); *H04N 25/76* (2023.01); *H10F 39/80373* (2025.01)

(58) Field of Classification Search
CPC .... H04N 25/709; H04N 25/76; H04N 25/773; H04N 25/70; H10F 39/80373

(Continued)

(56) References Cited

U.S. PATENT DOCUMENTS 11,665,445 B2 * 5/2023 Kim ...................... H04N 25/628
348/241
2006/0159387 A1 7/2006 Handelman
(Continued)

FOREIGN PATENT DOCUMENTS

JP 2018064086 A 4/2018
JP 2019012951 A 1/2019
(Continued)

*Primary Examiner* — Lin Ye
*Assistant Examiner* — Chan T Nguyen
(74) *Attorney, Agent, or Firm* — Canon U.S.A., Inc. IP Division

(57) ABSTRACT

A photoelectric conversion device includes an avalanche photodiode including a first terminal and a second terminal, a first power supply connected to the first terminal, a second power supply connected to the second terminal, and a switch for switching a resistance value between the first power supply and the first terminal. The first terminal of the avalanche photodiode is connected to each of a gate of a first p-channel metal-oxide semiconductor (PMOS) transistor and a gate of a first n-channel MOS (NMOS) transistor, the first PMOS transistor and the first NMOS transistor being connected in series between a third and a fourth power supplies. The photoelectric conversion device further includes a first cut-off unit for cutting off an electrical path between the third power supply and the fourth power supply, and if the switch is controlled to a standby state, the first cut-off unit cuts off the electrical path.

16 Claims, 20 Drawing Sheets

(58) Field of Classification Search
 USPC ......................................................... 348/308
 See application file for complete search history.

(56)                  References Cited

U.S. PATENT DOCUMENTS

| | | | |
|---|---|---|---|
| 2008/0002177 A1 | 1/2008 | Chang | |
| 2016/0020235 A1* | 1/2016 | Yamashita ............ | H10F 39/811 |
| | | | 250/206 |
| 2017/0018587 A1* | 1/2017 | Ohmaru ................. | H04N 25/57 |
| 2019/0327424 A1* | 10/2019 | Sasaki .................. | H04N 25/773 |
| 2020/0273895 A1 | 8/2020 | Sasago | |
| 2023/0204415 A1* | 6/2023 | Inoue ................... | H10F 30/225 |
| | | | 250/200 |

FOREIGN PATENT DOCUMENTS

| | | | |
|---|---|---|---|
| JP | 2019193043 A | 10/2019 | |
| JP | 2020028081 A | 2/2020 | |
| WO | 2019012370 A1 | 1/2019 | |
| WO | 2021090691 A1 | 5/2021 | |

* cited by examiner

FIG.6A
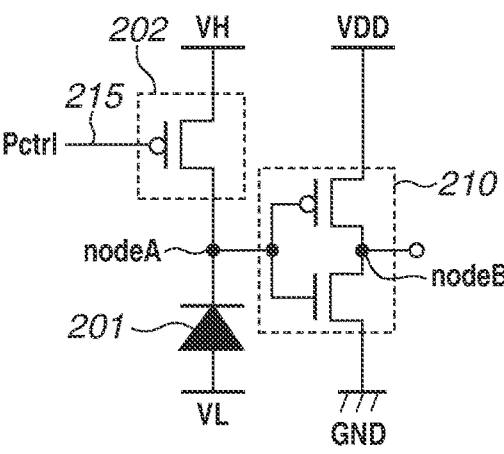
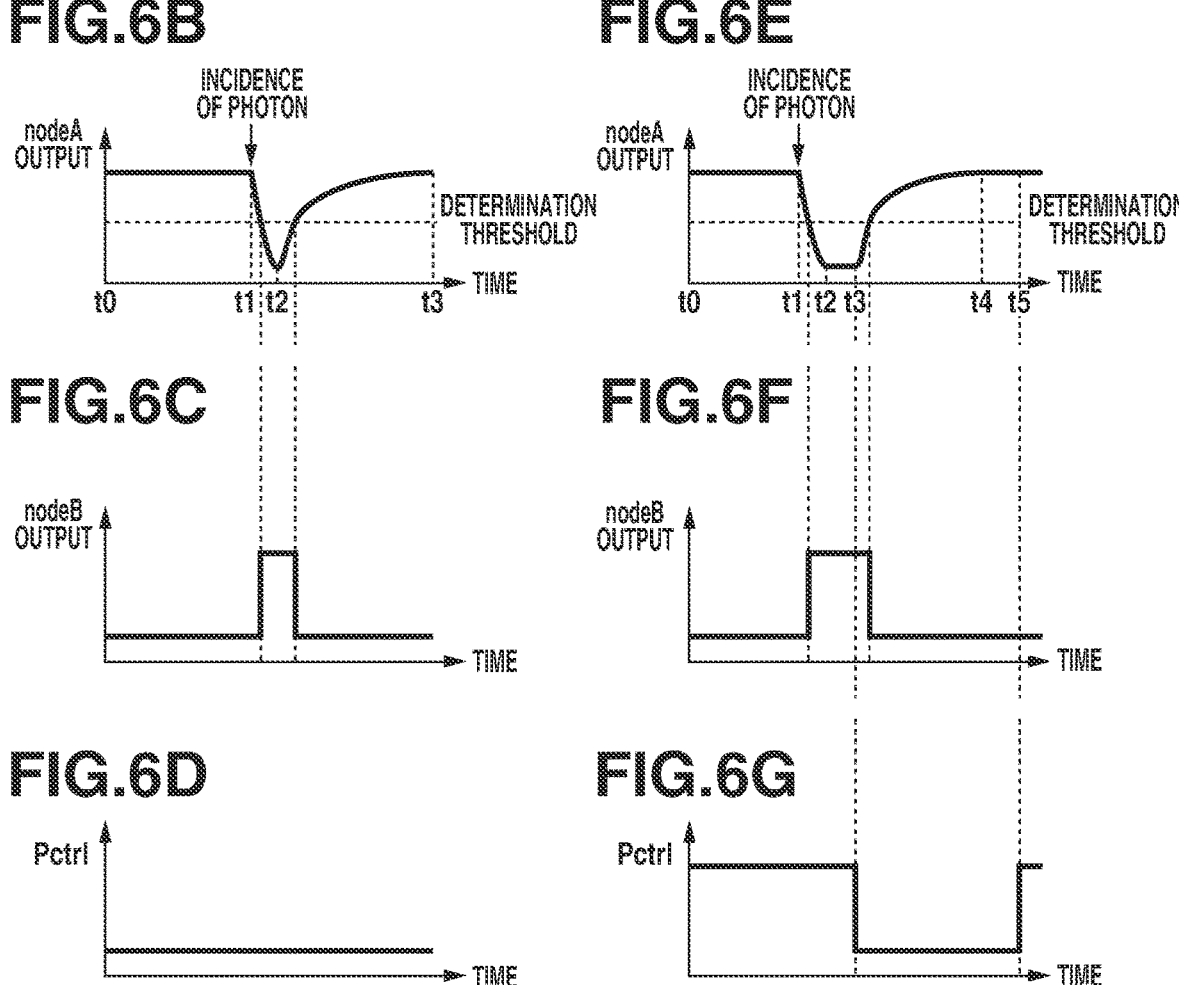
FIG.6B
FIG.6E
FIG.6C
FIG.6F
FIG.6D
FIG.6G

IMAGE CAPTURING DEVICE ~*2310*

IMAGE PROCESSING UNIT ~*2312*

PARALLAX ACQUISITION UNIT ~*2314*

DISTANCE MEASUREMENT UNIT ~*2316*

COLLISION DETERMINATION UNIT ~*2318*

*2320*

VEHICLE INFORMATION ACQUISITION DEVICE

*2330*~ ECU

ALARM DEVICE ~*2340*

FIG.18

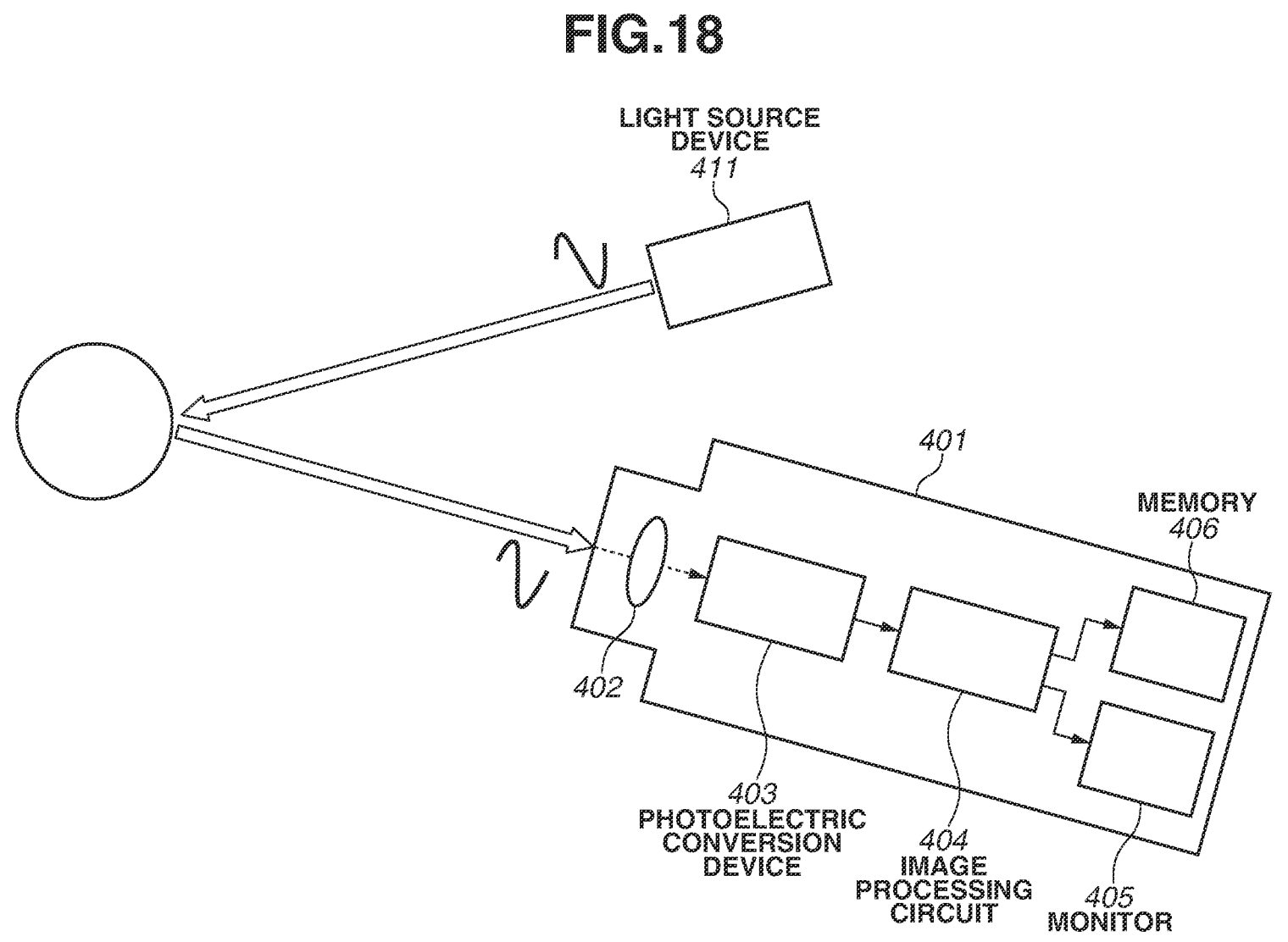

LIGHT SOURCE DEVICE
411

401

MEMORY
406

405
MONITOR

404
IMAGE PROCESSING CIRCUIT

403
PHOTOELECTRIC CONVERSION DEVICE

402

PHOTOELECTRIC CONVERSION DEVICE, PHOTOELECTRIC CONVERSION SYSTEM, AND MOVING BODY

CROSS-REFERENCE TO RELATED APPLICATIONS

This application is a Continuation of International Patent Application No. PCT/JP2022/037576, filed Oct. 7, 2022, which claims the benefit of Japanese Patent Application No. 2021-171689, filed Oct. 20, 2021, both of which are hereby incorporated by reference herein in their entirety.

BACKGROUND

Technical Field

One disclosed aspect of the embodiments relates to a photoelectric conversion device, a photoelectric conversion system, and a moving body.

Background Art

A photoelectric conversion device having a configuration in which a plurality of pixels each including an avalanche photodiode (hereinafter abbreviated as APD) is arranged is known. Each pixel can detect light in a single photon level using a phenomenon in which photocharge generated due to incidence of a photon on the APD causes avalanche multiplication. PTL 1 discusses a photo-detection apparatus capable of suppressing deterioration of photo-detection efficiency while reducing noise.

CITATION LIST

Patent Literature

PTL 1: Japanese Patent Application Laid-Open No. 2018-064086

In the photo-detection apparatus discussed in PTL 1, a phenomenon that occurs when a switch for controlling the voltage of the APD is turned off has not been fully considered. Accordingly, one aspect of the embodiment is directed to providing a photoelectric conversion device capable of dealing with a phenomenon that occurs when a switch for controlling the voltage of the APD is turned off.

SUMMARY

According to an aspect of the disclosure, a photoelectric conversion device includes an avalanche photodiode including a first terminal and a second terminal, a first power supply connected to the first terminal, a second power supply connected to the second terminal, and a switch configured to switch a resistance value between the first power supply and the first terminal. The first terminal of the avalanche photodiode is connected to each of a gate of a first p-channel metal-oxide semiconductor (PMOS) transistor and a gate of a first n-channel MOS (NMOS) transistor, the first PMOS transistor and the first NMOS transistor being connected in series between a third power supply and a fourth power supply. The photoelectric conversion device further comprises a first cut-off unit configured to cut off an electrical path between the third power supply and the fourth power supply, and in a case where the switch is controlled to a standby state, the first cut-off unit cuts off the electrical path.

Further features of the disclosure will become apparent from the following description of exemplary embodiments with reference to the attached drawings.

BRIEF DESCRIPTION OF THE DRAWINGS

FIG. 6A illustrates a part of the circuit chip in the photoelectric conversion device according to the first exemplary embodiment.

FIG. 6B schematically illustrates a relationship between an output signal and an operation of an avalanche photodiode (APD) of the photoelectric conversion device according to the first exemplary embodiment.

FIG. 6C schematically illustrates the relationship between the output signal and the operation of the APD of the photoelectric conversion device according to the first exemplary embodiment.

FIG. 6D schematically illustrates the relationship between the output signal and the operation of the APD of the photoelectric conversion device according to the first exemplary embodiment.

FIG. 6E schematically illustrates a relationship between an output signal and an operation of the APD of the photoelectric conversion device according to the first exemplary embodiment.

FIG. 6F schematically illustrates the relationship between the output signal and the operation of the APD of the photoelectric conversion device according to the first exemplary embodiment.

FIG. 6G schematically illustrates the relationship between the output signal and the operation of the APD of the photoelectric conversion device according to the first exemplary embodiment.

FIG. 16 is a functional block diagram of a photoelectric conversion system according to a sixth exemplary embodiment.

FIG. 18 is a functional block diagram of a photoelectric conversion system according to an eighth exemplary embodiment.

DESCRIPTION OF THE EMBODIMENTS

Figure 1:
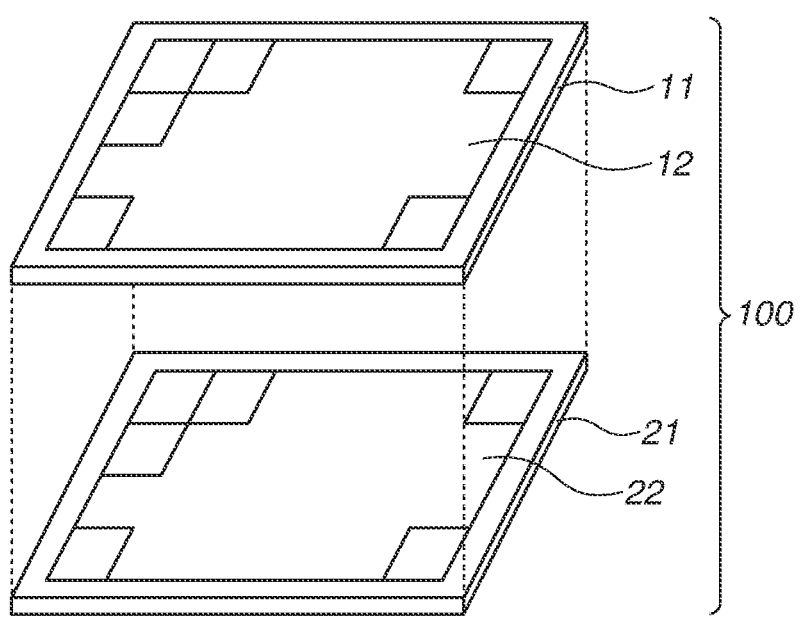
FIG. 1 is a schematic view illustrating a configuration example of a photoelectric conversion device according to a first exemplary embodiment.

The following exemplary embodiments are intended to embody the technical idea of the disclosure and do not limit the disclosure. Some of the sizes and positional relationships of members illustrated in the drawings are exaggerated to clarify the description. In the following description, the same components are denoted by the same reference numerals, and descriptions thereof may be omitted.

Exemplary embodiments of the disclosure will be described in detail below with reference to the drawings. In the following description, the terms which designate specific directions or positions (e.g., "up", "down", "right", "left", and other terms including such terms) are used as needed. Such terms are used for clear understanding of the exemplary embodiments with reference to the drawings, and the technical scope of the disclosure is not limited by the meanings of the terms.

The term "plan view" as used herein refers to a view in a direction perpendicular to a light incidence surface of semiconductor layers. The term "section" as used herein refers to a surface perpendicular to the light incidence surface of the semiconductor layers. If the light incidence surface of the semiconductor layers is a rough surface when the surface is viewed microscopically, the plan view is defined based on the light incidence surface of the semiconductor layers when viewed macroscopically.

In the following description, assume that the anode of an avalanche photodiode (APD) is set to a fixed potential and a signal is taken out of the cathode of the APD. Accordingly, a semiconductor region of a first conductivity type where charges having the same polarity as that of signal charges are the majority carriers is an n-type semiconductor region, and a semiconductor region of a second conductivity type where charges having a polarity different from that of signal charges are the majority carriers is a p-type semiconductor region.

The disclosure is also applicable to a configuration in which the cathode of the APD is set to a fixed potential and a signal is taken out of the anode of the APD. In such a case, the semiconductor region of the first conductivity type where charges having the same polarity as that of signal charges are the majority carriers is the p-type semiconductor region, and the semiconductor region of the second conductivity type where charges having a polarity different from that of signal charges are the majority carriers is the n-type semiconductor region. Hereinafter, a configuration example where either one of the nodes of the APD is set to a fixed potential will be described. However, both nodes of the APD may be variable in potential.

The term "impurity concentration" as used herein refers to a net impurity concentration compensated for impurities of opposite conductivity type. In other words, the term "impurity concentration" refers to a net doping concentration. A region where the concentration of a p-type doping impurity is higher than the concentration of an n-type doping impurity corresponds to the p-type semiconductor region. A region where the concentration of an n-type doping impurity is higher than the concentration of a p-type doping impurity corresponds to the n-type semiconductor region.

FIG. 1 is a schematic view illustrating a configuration example of a stacked photoelectric conversion device according to a first exemplary embodiment. A photoelectric conversion device 100 has a configuration in which two chips, i.e., a sensor chip 11 and a circuit chip 21, are stacked and the two chips are electrically connected.

The sensor chip 11 is provided with a pixel region 12, and the circuit chip 21 is provided with a circuit region 22 for processing signals detected in the pixel region 12.

Figure 2:
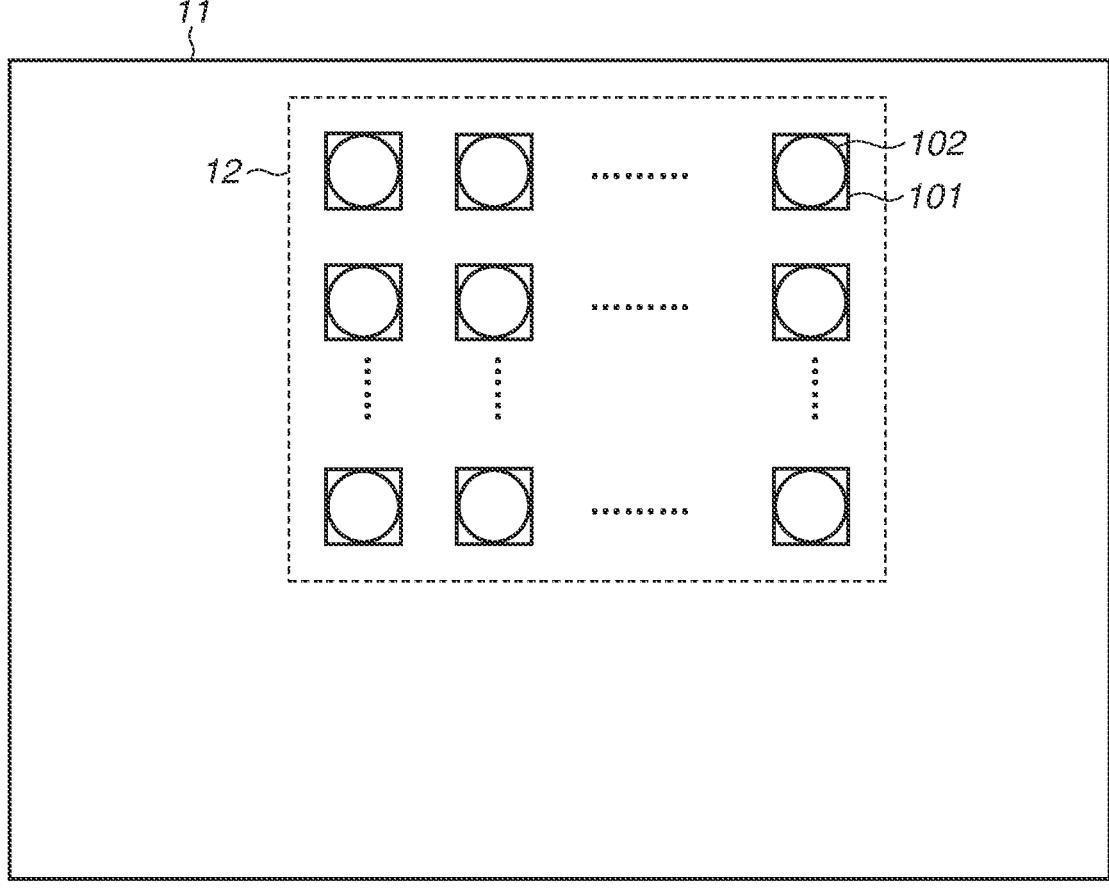
FIG. 2 illustrates a layout example of a sensor chip of the photoelectric conversion device according to the first exemplary embodiment.

FIG. 2 illustrates a layout example of the sensor chip 11. Pixels 101 each including a photoelectric conversion unit 102 including an APD are two-dimensionally arranged and form the pixel region 12.

The pixels 101 are typically used for forming an image. However, in Time of Flight (ToF) applications, the pixels 101 are not necessarily used to form an image. Specifically, the pixels 101 may be used to measure the time of arrival of light and the amount of the light.

Figure 3:
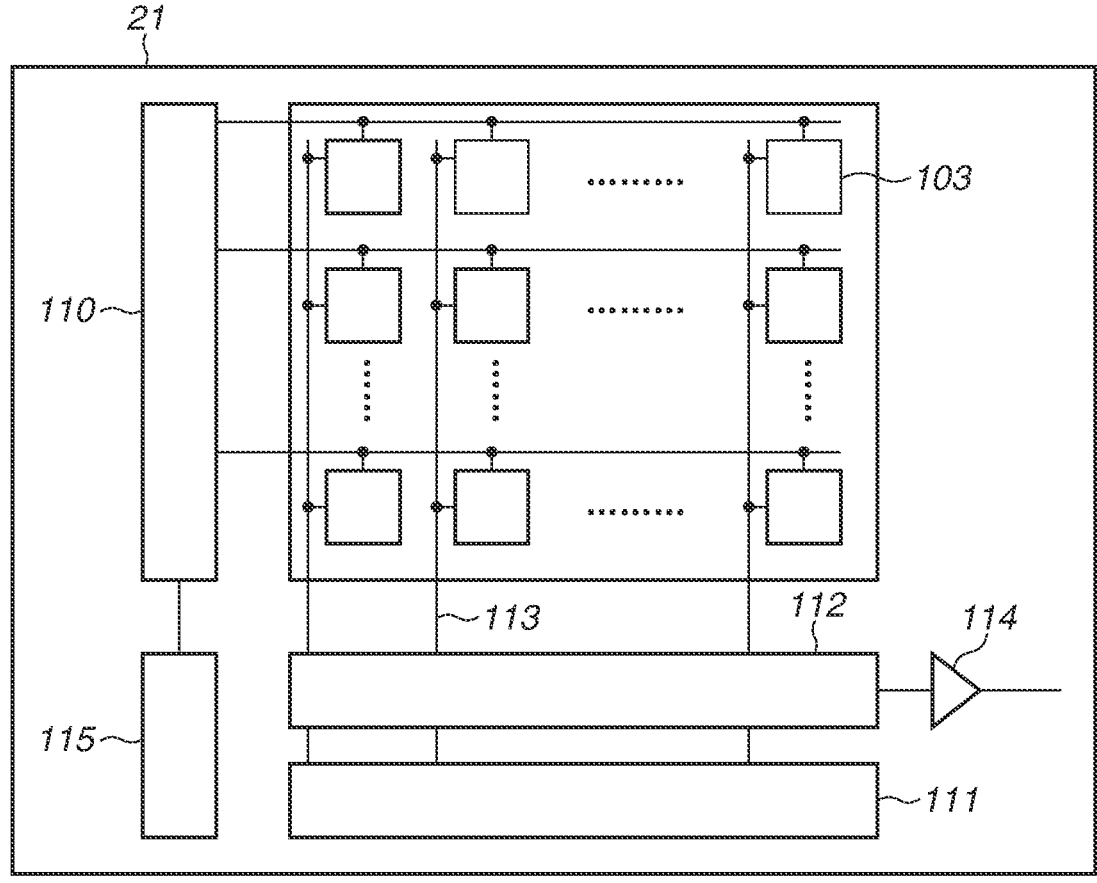
FIG. 3 is a configuration diagram illustrating a configuration example of a circuit chip of the photoelectric conversion device according to the first exemplary embodiment.

FIG. 3 is a configuration diagram of the circuit chip 21. The circuit chip 21 includes signal processing units 103 for processing charges photoelectrically converted by the photoelectric conversion unit 102 illustrated in FIG. 2, a readout circuit 112, a control pulse generation unit 115, a horizontal scanning circuit unit 111, signal lines 113, and a vertical scanning circuit unit 110. Each signal processing unit 103 outputs the photoelectrically converted electric signals to the readout circuit 112. The readout circuit 112 stores the signals for each row output from each signal processing unit 103.

The photoelectric conversion units 102 illustrated in FIG. 2 and the signal processing units 103 illustrated in FIG. 3 are electrically connected via connection wires provided for the respective pixels 101.

In the present exemplary embodiment, two chips, i.e., the sensor chip 11 and the circuit chip 21, are stacked, but instead the pixel region 12 of the sensor chip 11 and the circuit region 22 of the circuit chip 21 may be provided on a single chip.

The vertical scanning circuit unit 110 receives a control pulse supplied from the control pulse generation unit 115 and supplies the control pulse to each pixel 101. Logic circuits, such as a shift register and an address decoder, are used for the vertical scanning circuit unit 110.

A signal output from the photoelectric conversion unit 102 in each pixel 101 is processed by the signal processing unit 103. The signal processing unit 103 is provided with, for example, a counter, and a memory. In the memory, digital values are held.

The horizontal scanning circuit unit 111 supplies control pulses for sequentially selecting columns to the signal processing units 103 so as to read out signals from the memory of each pixel 101 in which digital signals are held.

In the selected column, a signal of the signal processing unit 103 in the pixel 101 selected by the virtual scanning circuit unit 110 is output to each signal line 113.

The signal output to each signal line 113 is output to an external recording unit or signal processing unit, which is provided outside the photoelectric conversion device 100, via the readout circuit 112 and an output circuit 114.

In the example illustrated in FIG. 2, the pixels 101 in the pixel region 12 may be one-dimensionally arranged. The functions of the signal processing units 103 are not necessarily provided for all the pixels 101. For example, one signal processing unit 103 may be shared by the plurality of pixels 101 and signal processing may be sequentially performed.

Figure 4:
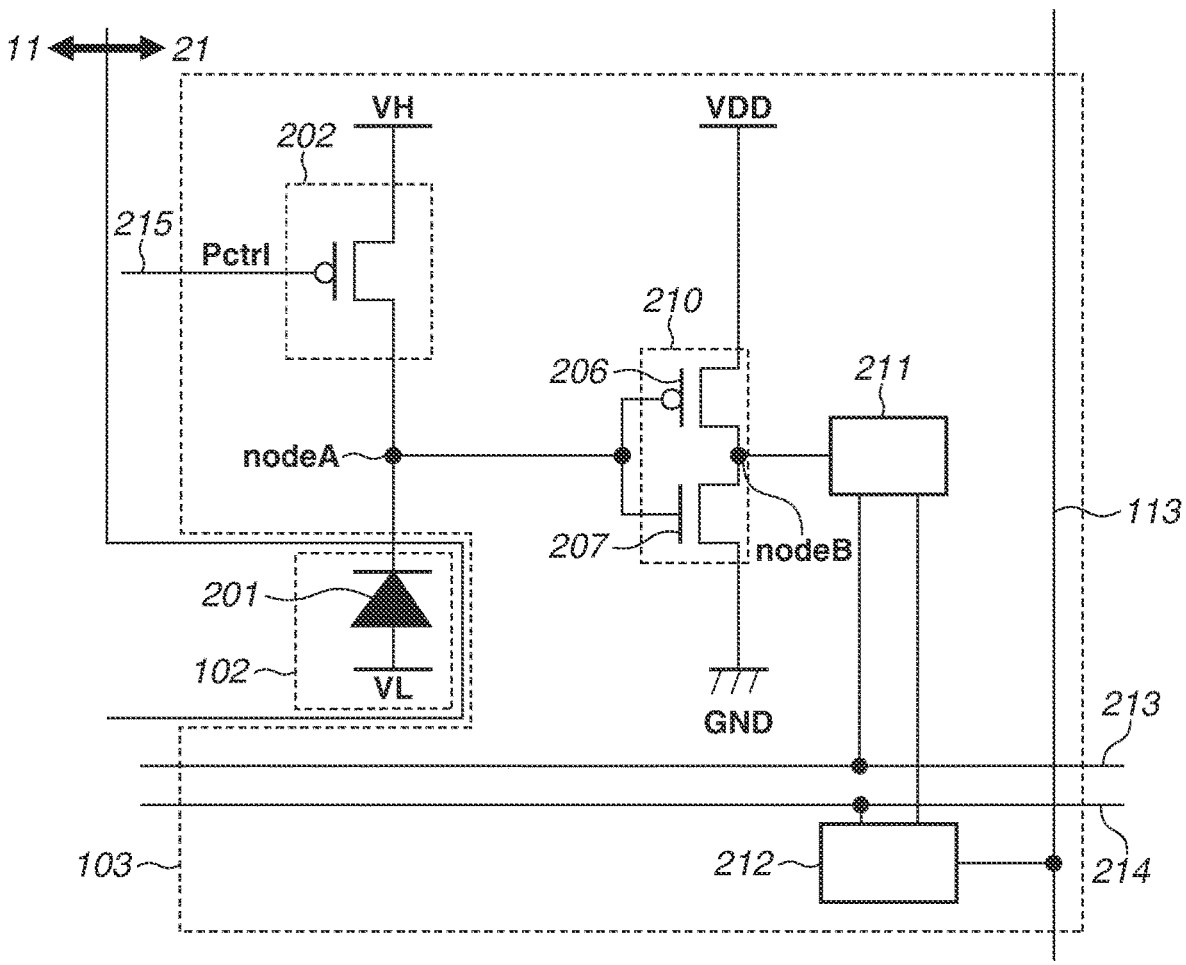
FIG. 4 is a block diagram corresponding to one pixel of a sensor chip and a circuit chip according to a comparative example of the first exemplary embodiment.
Figure 5:
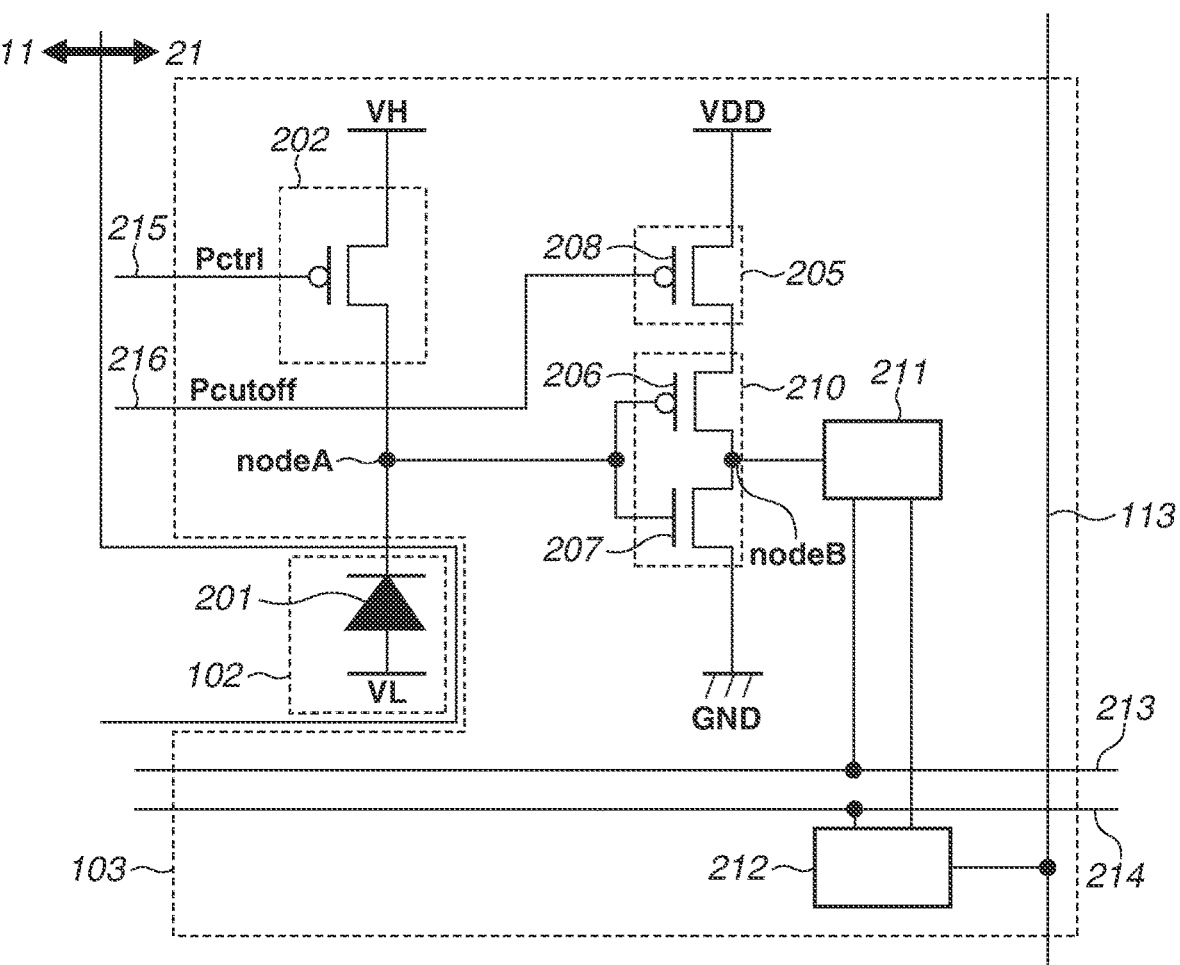
FIG. 5 is a block diagram corresponding to one pixel of the sensor chip and the circuit chip in the photoelectric conversion device according to the first exemplary embodiment.

FIG. 4 is an example of a block diagram including an equivalent circuit corresponding to one pixel illustrated in FIGS. 2 and 3 according to a comparative example. FIG. 5 is an example of a block diagram including an equivalent circuit corresponding to one pixel illustrated in FIGS. 2 and 3 in the photoelectric conversion device 100 according to the present exemplary embodiment. As illustrated in FIGS. 4 and 5, the photoelectric conversion unit 102 including an APD 201 is provided on the sensor chip 11 and the other members are provided on the circuit chip 21. The photoelectric conversion device 100 according to the present exemplary embodiment illustrated in FIG. 5 differs from the photoelectric conversion device according to the comparative example illustrated in FIG. 4 in that the photoelectric conversion device 100 according to the present exemplary embodiment includes a cut-off unit 205.

The APD 201 generates charge pairs corresponding to incident light by photoelectric conversion. A power supply VH (first power supply) supplies the cathode of the APD 201 with a voltage that is higher than the voltage supplied to the anode of the APD 201. A power supply VL (second power supply) supplies the anode of the APD 201 with a voltage. A reverse bias voltage for causing the APD 201 to perform an avalanche multiplication operation is supplied to the anode and the cathode of the APD 201. With the voltage supplied, the charges generated by the incident light cause avalanche multiplication, thereby generating an avalanche current.

The reverse bias voltage can be supplied in a Geiger mode and a linear mode. In the Geiger mode, the APD 201 operates with a potential difference greater than a breakdown voltage between the anode and the cathode of the APD 201. In the linear mode, the APD 201 operates with a voltage difference close to the breakdown voltage or less between the anode and the cathode of the APD 201. The APD operating in the Geiger mode is referred to as a single-photon avalanche diode (SPAD). For example, the power supply VL is −30 V (volts) and the power supply VH is 1 V.

The anode or cathode of the APD 201 is connected to a node A (first terminal). The node A is connected to each of the gate of a p-channel metal-oxide semiconductor (PMOS)

transistor 206, the gate of a first n-channel MOS (NMOS) transistor 207, and a switch 202.

The switch 202 is located between the power supply VH and the APD 201. The switch 202 switches a resistance value between the power supply VH and the APD 201. The switch 202 includes a function of replacing a change in avalanche current generated in the APD 201 with a voltage signal. The switch 202 functions as a load circuit (quenching circuit) during signal multiplication by avalanche multiplication, and also includes a function of reducing the voltage supplied to the APD 201 and suppressing the avalanche multiplication (quenching operation). The switch 202 is controlled between a state (standby state) where the switch 202 is in a non-conductive state and the potential of the cathode is held and a state (recharging state) where the switch 202 is in a conductive state and the potential that causes avalanche multiplication is applied to the cathode of the APD 201. The standby state and the recharging state are controlled by a control signal Pctrl via a first control line 215. For example, when the control signal Pctrl is at a high level, the switch 202 is turned off and the APD 201 is controlled to the standby state, and when the control signal Pctrl is at a low level, the switch 202 is turned on and the APD 201 is controlled to the recharging state.

The signal processing unit 103 illustrated in FIG. 4 includes a waveform shaping unit 210, a counter circuit 211, and a selection circuit 212. The signal processing unit 103 illustrated in FIG. 5 includes the waveform shaping unit 210, the cut-off unit 205, the counter circuit 211, and the selection circuit 212.

The waveform shaping unit 210 shapes the waveform of a change in the potential of the cathode of the APD 201 obtained upon detection of a photon, and outputs a pulse signal. As the waveform shaping unit 210, an inverter circuit composed of the first PMOS transistor 206 and the first NMOS transistor 207 is used. The drain of the first PMOS transistor 206 and the drain of the first NMOS transistor 207 are each connected to a node B. The source of the first NMOS transistor 207 is connected to a ground potential (GND). For example, GND has 0 V. The node B is connected to an input terminal of a counter circuit 211. This inverter circuit determines whether the signal output from the APD 201 exceeds a determination threshold, and outputs a signal inverted in magnitude relation relative to a threshold for the input signal. An output signal from the inverter circuit is a pulse wave obtained by shaping the waveform of a change in the cathode voltage. Specifically, the inverter circuit includes a waveform shaping function to shape continuous signals output from the APD 201 into signals having a pulse shape and output the signals.

A flow-through current that flows through the inverter circuit of the waveform shaping unit 210 will be described with reference to FIG. 4. As described above, such an inverter circuit determines whether the signal output from the APD 201 exceeds the determination threshold. The term "determination threshold" refers to a potential at which ON and OFF states of the first PMOS transistor 206 and the first NMOS transistor 207 are switched. For example, when the signal input to the inverter circuit is at the low level, the first PMOS transistor 206 constituting the inverter circuit is turned on and the first NMOS transistor 207 is turned off. When a parasitic capacitance is charged by VDD, the output of the node B transitions to the high level. When the signal input to the inverter circuit is at the high level, the first PMOS transistor 206 constituting the inverter circuit is turned off and the first NMOS transistor 207 is turned on.

When charges are discharged from parasitic capacitance to GND, the output of the node B transitions to the low level.

When the input signal is in a transition state between the high level and the low level, the potential transitions near the potential (determination threshold) at which the ON and OFF states of the first PMOS transistor 206 and the first NMOS transistor 207 are switched. In such a case, the input signal may be held at an intermediate potential at which both the first PMOS transistor 206 and the first NMOS transistor 207 are turned on. When the input signal is held at the intermediate potential, both the first PMOS transistor 206 and the first NMOS transistor 207, which are connected in series between VDD and GND, are turned on, so that a flow-through current flows between VDD and GND.

While FIGS. 4 and 5 illustrate an example where one inverter is used as the waveform shaping unit 210, the waveform shaping unit 210 may be composed of a logic circuit including an inverter.

In the example illustrated in FIG. 5, the cut-off unit 205 is provided between the power supply VDD (third power supply) and GND (fourth power supply) and cuts off the path between the power supply VDD and GND. The cut-off unit 205 is composed of a second PMOS transistor 208. The source of the second PMOS transistor 208 is connected to the power supply VDD. For example, the power supply VDD has 1 V.

FIG. 5 illustrates a configuration in which the power supply VH and the power supply VDD are provided separately. However, the power supply VH and the power supply VDD may be configured as a common power supply. The configuration of the common power supply makes it possible to reduce power required for the photoelectric conversion device 100.

The cut-off unit 205 is controlled between an operating state (ON) and a cut-off state (OFF). The cut-off unit 205 is controlled by a control signal Pcutoff via a second control line 216. For example, when the control signal Pcutoff is at the low level, the cut-off unit 205 is controlled to be in the ON state, and when the control signal Pcutoff is at a high level, the cut-off unit 205 is controlled to be in the OFF state. While FIG. 5 illustrates an example where a PMOS transistor is used as the cut-off unit 205, an NMOS transistor may be used, or any other circuit having a current cut-off effect may be used. The cut-off unit 205 may be provided between GND and the first NMOS transistor 207.

The counter circuit 211 counts the number of pulse signals output from the waveform shaping unit 210 and holds the count value. When a control pulse is supplied via a drive line 213, the signal held in the counter circuit 211 is reset.

The selection circuit 212 is supplied with the control pulse from the vertical scanning circuit unit 110 illustrated in FIG. 3 via a drive line 214 illustrated in FIG. 5 (not illustrate in FIG. 3), and switches electrical connection states, i.e., a connection state and a non-connection state, between the counter circuit 211 and the signal line 113. The selection circuit 212 includes, for example, a buffer circuit for outputting a signal.

A switch, such as a transistor, may be provided between the switch 202 and the APD 201 or between the photoelectric conversion unit 102 and the signal processing unit 103, to thereby switch the electrical connection states. Similarly, the supply of a voltage to the photoelectric conversion unit 102 may be electrically switched by a switch, such as a transistor.

The present exemplary embodiment illustrates a configuration example using the counter circuit 211. Instead of using the counter circuit 211, a time-to-digital converter (TDC) and a memory may be used for the photoelectric conversion device 100 to acquire a pulse detection timing. In such a case, the generation timing of a pulse signal output from the waveform shaping unit 210 is converted into a digital signal by the TDC. The TDC is supplied with a control pulse (reference signal) from the vertical scanning circuit unit 110 illustrated in FIG. 3 via a drive line to measure the timing of the pulse signal. The TDC acquires a signal obtained using, as a relative time, an input timing of a signal output from each pixel 101 via the waveform shaping unit 210 as a digital signal based on the control pulse.

FIGS. 6A to 6G each schematically illustrate a relationship between an output signal and an operation of the APD 201. FIG. 6A is a circuit diagram illustrating the APD 201, the switch 202, the waveform shaping unit 210, the node A, and the node B, which are illustrated in FIG. 4. FIGS. 6B, 6C, and 6D each illustrate a relationship between the output signal and the operation of the APD 201 when the switch 202 is constantly in a conductive state. FIGS. 6E, 6F, and 6G each illustrate a relationship between the output signal and the operation of the APD 201 when the switch 202 is controlled to be in the conductive state and the non-conductive state. FIGS. 6B and 6E each illustrate a change in the waveform of the node A illustrated in FIG. 6A. FIGS. 6C and 6F each illustrate a change in the waveform of the node B illustrated in FIG. 6A. FIGS. 6D and 6G each illustrate a change in the waveform of the control signal Pctrl illustrated in FIG. 6A.

A relationship between the output signal and the operation of the APD 201 when the switch 202 illustrated in FIG. 6A is constantly in the ON state will be described with reference to FIGS. 6B to 6D.

During a period from time to t0 time t1, a potential difference VH–VL is applied to the APD 201 illustrated in FIG. 6A.

As illustrated in FIG. 6B, when a photon is incident on the APD 201 at time t1, an avalanche multiplication current flows to the switch 202 and the voltage of the node A drops. When the amount of voltage drop further increases and the potential difference applied to the APD 201 decreases, the avalanche multiplication of the APD 201 stops and the voltage level of the node A stops dropping beyond a certain value at time t2. Thereafter, a current to compensate for the voltage drop flows to the node A, and the potential of the node A settles at the original potential level at time t3.

In such a case, as illustrated in FIG. 6C, the portion of the output waveform at the node A falling below a certain threshold is shaped by the waveform shaping unit 210 and is output to the node B as a signal.

Next, a relationship between the output signal and the operation of the APD 201 when the switch 202 illustrated in FIG. 6A is controlled to be in the ON state and the OFF state will be described with reference to FIGS. 6E to 6G.

As illustrated in FIG. 6E, the switch 202 is in the OFF state during a period from time t0 to time t3. Accordingly, during a period from time t2 to time t3, the node A cannot compensate for (recover) the voltage drop due to the occurrence of avalanche multiplication. At time t3, the switch 202 is turned on. Thereafter, the voltage drop at the node A is compensated for, and at time t4, the node A is returned to the original potential level and settles at the original potential level. At time t5, the switch 202 is turned off and the APD 201 transitions to the standby state again.

Figure 7:
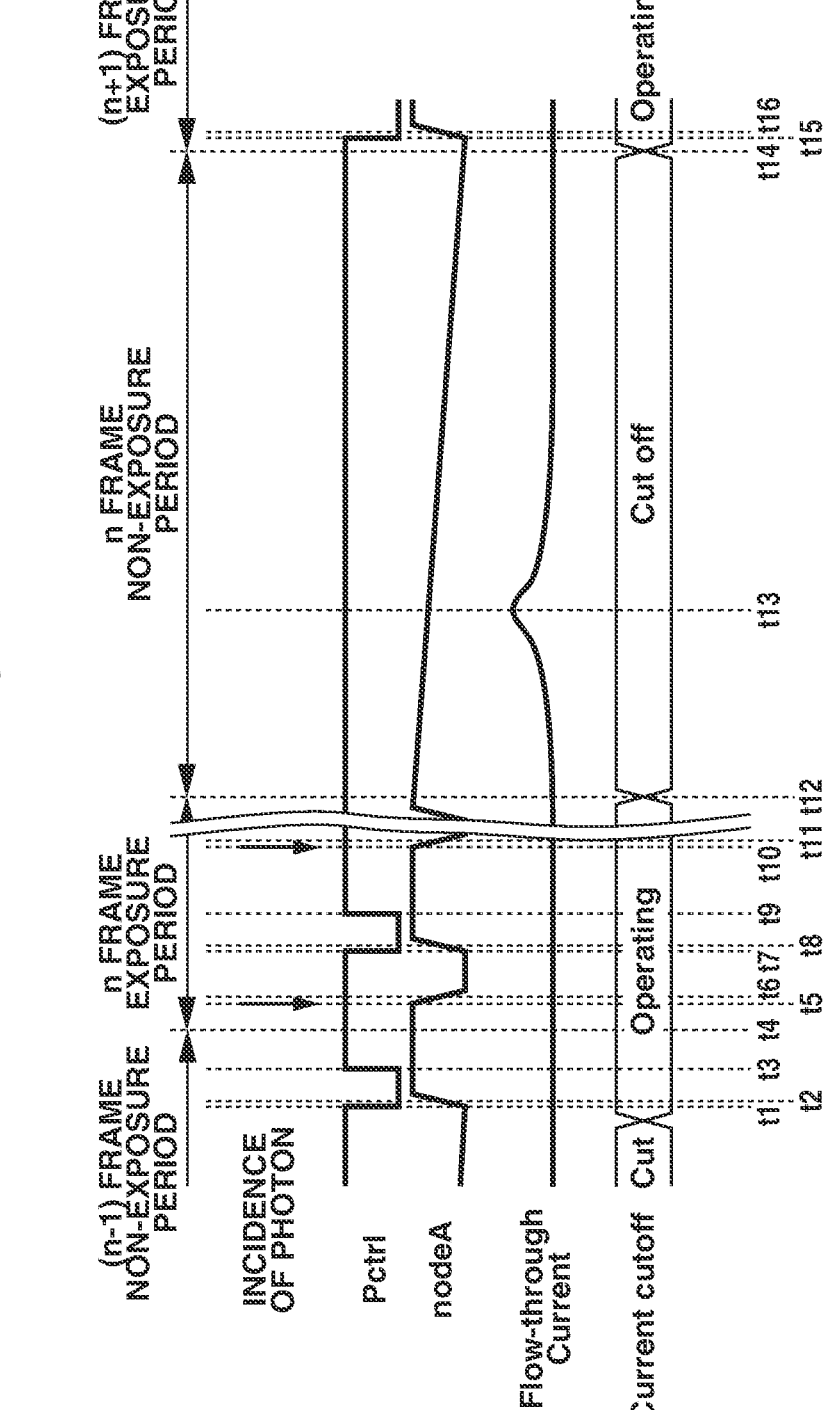
FIG. 7 is a drive timing diagram of one pixel according to the comparative example of the first exemplary embodiment.
Figure 8:
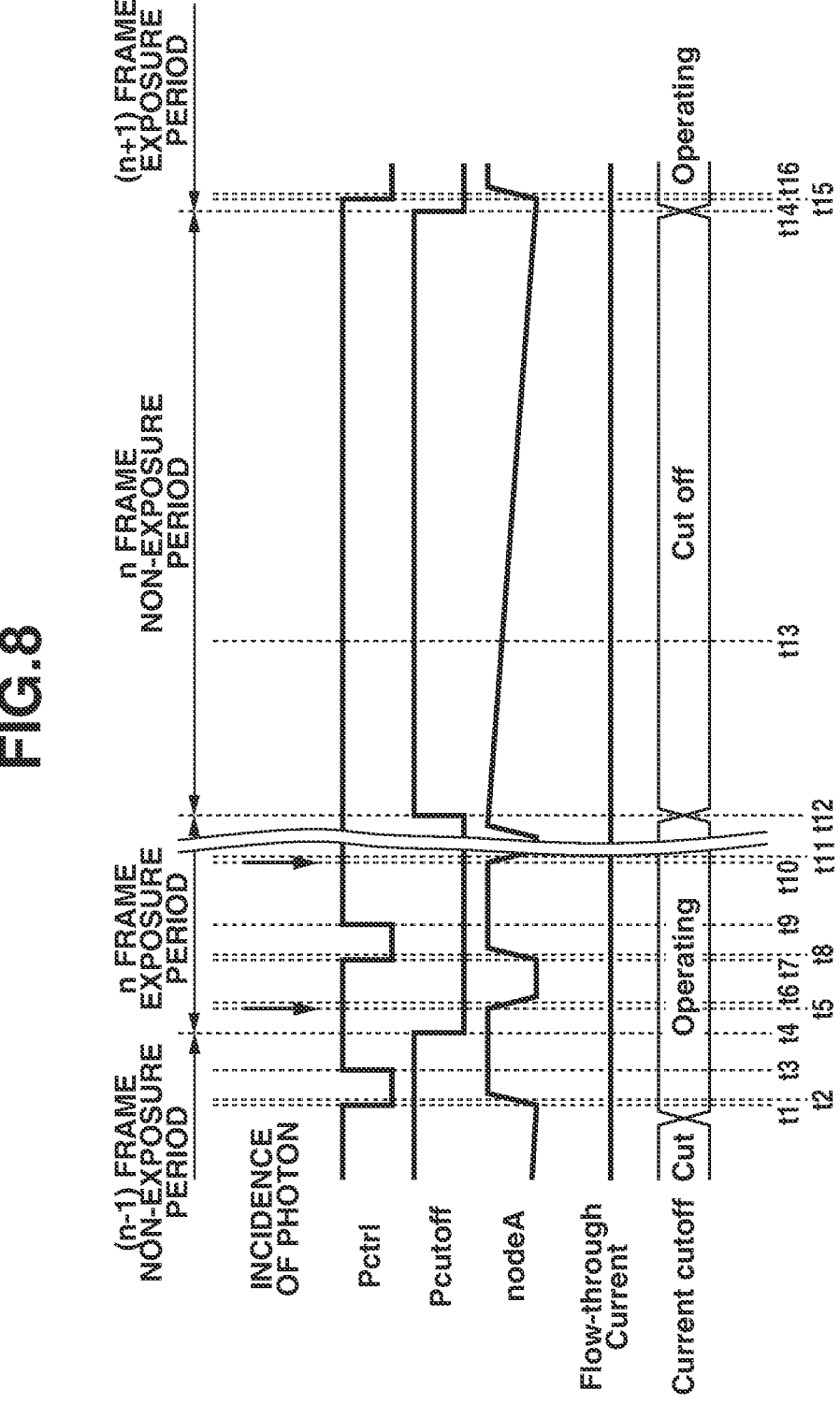
FIG. 8 is a drive timing diagram of one pixel of the photoelectric conversion device according to the first exemplary embodiment.

FIG. 7 is an example of a drive timing diagram of one pixel according to the comparative example illustrated in FIG. 4. FIG. 8 is an example of a drive timing diagram of one pixel according to the present exemplary embodiment illustrated in FIG. 5.

In FIGS. 7 and 8, a period from time t1 to time t4 corresponds to a non-exposure period of a (n−1)-frame. A period from time t4 to time t12 corresponds to an exposure period of an n-frame. A period from time t12 to time t14 corresponds to the non-exposure period of the n-frame. A period from time t14 to time t16 and the subsequent period correspond to the exposure period of a (n+1)-frame. When the exposure period is set to be shorter than the maximum exposure period of one frame, the non-exposure period occurs as a period other than the exposure period within the period of one pixel. The term "exposure period" as used herein refers to a period in which a photon detection operation is performed in the APD 210, and a photon detection signal corresponding to the photon detected during this period is output to the APD 210. The term "non-exposure period" refers to a period in which a shutter operation or the like is performed to control the APD 210 not to perform the photon detection operation. A period is also treated as the non-exposure period in which the photon detection operation or output operation is interrupted by a crop operation for stopping the photon detection operation within the exposure period of a certain pixel region among the plurality of pixels 101, a thinning-out operation for thinning out pixels 101 periodically, for example, every other row or every two rows, or the like.

A control signal EN that defines the exposure period may be input to the counter circuit 211 to synchronize the exposure period with the operation of the counter circuit 211. Specifically, when the control signal EN transitions from the low level to the high level, the exposure period starts, and when the control signal EN transitions from the high level to the low level, the exposure period ends and the operation of the counter circuit 211 stops.

FIG. 7 will now be described.

At time t1 during the non-exposure period of the (n−1)-frame, the control signal Pctrl transitions from the high level to the low level, so that the switch 202 is turned on and the APD 201 transitions to the recharging state.

At time t2, the potential of the node A exceeds the determination threshold of the waveform shaping unit 210. At this time, the flow-through current flows to GND from the power supply VDD. Thereafter, the potential of the node A settles at the potential level at which avalanche multiplication is possible.

At time t3, the control signal Pctrl transitions from the low level to the high level, so that the switch 202 is turned off and the APD 201 transitions to the standby state.

At time t4, the non-exposure period of the (n−1)-frame ends and the exposure period of the n-frame starts.

At time t5, a photon is incident on the APD 201, so that the avalanche multiplication current flows and the potential of the node A drops.

At time t6, the potential of the node A exceeds the determination threshold of the waveform shaping unit 210. At this time, the flow-through current flows to GND from the power supply VDD.

At time t7, the control signal Pctrl transitions from the high level to the low level, so that the switch 202 is turned on and the APD 201 transitions to the recharging state.

At time t8, the potential of the node A exceeds the determination threshold of the waveform shaping unit 210. In this case, the flow-through current flows to GND from the power supply VDD. Thereafter, the potential of the node A settles at the potential level at which avalanche multiplication is possible.

At time t9, the control signal Pctrl transitions from the low level to the high level, so that the switch 202 is turned off and the APD 201 transitions to the standby state.

At time t10, a photon is incident on the APD 201, so that the avalanche multiplication current flows and the potential of the node A drops.

At time t11, the signal at the node exceeds the determination threshold of the waveform shaping unit 210. In this case, the flow-through current flows to GND from the power supply VDD. The operation in the subsequent exposure period is similar to that in a period from time t4 to time t11 based on the operation of the control signal Pctrl.

At time t12, the exposure period of the n-frame ends and the non-exposure period of the n-frame starts. At this time, the control signal Pctrl is at the high level and the switch 202 is in the OFF state. Thus, the node A is floating. When a reverse current flows to the APD 201 during the period in which the node A is floating, the potential of the node A drops. At this time, since the APD 210 is in the standby state, the node A cannot compensate for (recover) the voltage drop due to the occurrence of avalanche multiplication, so that the potential of the node A continuously drops due to the generation of the reverse current.

At time t13, the potential of the node A is held at the intermediate potential at which both the first PMOS transistor 206 and the first NMOS transistor 207, which constitute the subsequent-stage waveform shaping unit 210, are turned on. A flow-through current greater than the flow-through current that flows at time t2 or time t6 flows to waveform shaping unit 210. The signal at the node A exceeds the determination threshold of the waveform shaping unit 210.

The reason that the flow-through current that flows at time t13 is greater than the flow-through current that flows at time t2 or time t6 will be described below. During the exposure period, the APD 210 operates based on the control signal Pctrl, and a decrease in the potential of the node A due to the occurrence of avalanche multiplication and an increase in the potential of the node A due to recharging are repeated. Accordingly, the potential of the node A is held only for a short period of time at the intermediate potential both upon decrease in the potential of the node A due to the occurrence of avalanche multiplication and upon increase in the potential of the node A due to recharging. In contrast, the potential of the node A during the non-exposure period varies depending on the current generated when the APD 210 operates in the linear mode, so that the node A is held at the intermediate potential for a relatively long period of time. Accordingly, when the flow-through current flows during the non-exposure period, the period in which the flow-through current flows is longer than that during the exposure period, which may result in an increase in power consumption.

At time t14, the non-exposure period of the n-frame ends and the exposure period of the (n+1)-frame starts.

At time t15, the control signal Pctrl transitions from the high level to the low level, so that the switch 202 is turned on and the APD 201 transitions to the recharging state.

At time t16, the potential of the node A exceeds the determination threshold of the waveform shaping unit 210. Thereafter, the potential of the node A settles at the potential level at which avalanche multiplication is possible. The operation in the period after time t14 is similar to the operation in the exposure period of the n-frame.

FIG. 8 will now be described.

At time t1, the control signal Pctrl transitions from the high level to the low level, so that the switch 202 is turned on and the APD 201 transitions to the recharging state. Thereafter, the potential of the node A settles at the potential level at which avalanche multiplication is possible.

At time t2, the potential of the node A exceeds the determination threshold of the waveform shaping unit 210. Since the control signal Pcutoff is at the high level and the cut-off unit 205 is in the cut-off state, the electrical path from the power supply VDD to GND is cut off, so that no flow-through current flows.

At time t3, the control signal Pctrl transitions from the low level to the high level, so that the switch 202 is turned on and the APD 201 transitions to the standby state.

At time t4, the control signal Pcutoff transitions from the high level to the low level, and the cut-off unit 205 transitions to the operating state.

At time t5, a photon is incident on the APD 201, so that the avalanche multiplication current flows and the potential of the node A drops.

At time t6, the potential of the node A exceeds the determination threshold of the waveform shaping unit 210. At this time, since the cut-off unit 205 is in the operating state and the electrical path from the power supply VDD to GND is in the conductive state, the flow-through current flows to GND from the power supply VDD.

At time t7, the control signal Pctrl transitions from the high level to the low level, so that the switch 202 is turned off and the APD 201 transitions to the recharging state.

At time t8, the potential of the node A exceeds the determination threshold of the waveform shaping unit 210. At this time, the flow-through current flows to GND from the power supply VDD. Thereafter, the potential of the node A settles at the potential level at which avalanche multiplication is possible.

At time t9, the control signal Pctrl transitions from the low level to the high level, so that the switch 202 is turned off and the APD 201 transitions to the standby state.

At time t10, a photon is incident on the APD 201, so that the avalanche multiplication current flows and the potential of the node A drops.

At time t11, the potential of the node A exceeds the determination threshold of the waveform shaping unit 210. At this time, the flow-through current flows to GND from the power supply VDD. The operation in the subsequent exposure period is similar to that in the period from time t4 to time t11.

At time t12, the control signal Pcutoff transitions from the low level to the high level, and the cut-off unit 205 transitions to the cut-off state. At this time, the control signal Pctrl is at the high level, the switch 202 is turned on, and the APD 201 transitions to the standby state.

Thus, the node A is floating. During the period in which the node A is floating, a reverse current flows through the APD 201 and the potential of the node A drops.

At time t13, the potential of the node A is held at the intermediate potential at which both the first PMOS transistor 206 and the first NMOS transistor 207, which constitute the subsequent-stage waveform shaping unit 210, are turned on. However, in the present exemplary embodiment, the cut-off unit 205 is in the cut-off state, which prevents the flow-through current from flowing from the power supply VDD to GND. The signal at the node A exceeds the determination threshold of the waveform shaping unit 210.

At time t14, the control signal Pcutoff transitions from the high level to the low level, and the cut-off unit 205 transitions to the operating state.

At time t15, the control signal Pctrl transitions from the high level to the low level, and the switch 202 transitions to the recharging state.

At time t16, the signal at the node A exceeds the determination threshold of the waveform shaping unit 210. Thereafter, the potential of the node A settles at the original potential level at which avalanche multiplication is possible. The operation in the period after time t14 is similar to the operation in the exposure period of the n-frame.

According to the present exemplary embodiment, as described above, the path between the power supply VDD and GND is cut off to thereby prevent the flow-through current from flowing through the waveform shaping unit 206 during the non-exposure period, according to the present exemplary embodiment. While the present exemplary embodiment described above illustrates an example where each pixel 101 includes the exposure period and the non-exposure period, the disclosure can also be applied to a dummy pixel that functions as, for example, a so-called optical black (OPB) pixel being cut off. Even in such a dummy pixel, a flow-through current is generated during a period in which the switch 202 is turned off.

In the configuration illustrated in FIG. 5, the output of the waveform shaping unit 210 can be floating when the cut-off unit 205 is in the OFF state (cut-off state). However, there is a possibility that the flow-through current can flow between the power supply and GND in an element constituting the counter circuit 211, and thus the floating state of the signal to be input to the counter circuit 211 is undesirable. When the cut-off unit 205 is in the cut-off state, a switch may therefor be additionally located between the output of the waveform shaping unit 210 and the power supply or GND so that the output of the waveform shaping unit 210 transitions to the high level or the low level. Specifically, a first terminal of the switch is connected to a node between the output terminal of the waveform shaping unit 210 and the input terminal of the counter circuit 211, and a second terminal of the switch is connected to the power supply or GND. In this configuration, the output of the waveform shaping unit 210 is fixed at the high level or the low level according to the operation of the switch described above when the cut-off unit 205 is in the cut-off state. This configuration brings the signal to be input to the counter circuit 211 into the floating state, thereby preventing the flow-through current from being generated in the counter circuit 211.

A photoelectric conversion device according to a second exemplary embodiment will be described with reference to FIGS. 9 and 10. Components of the photoelectric conversion device according to the second exemplary embodiment that are similar to those of the photoelectric conversion device according to the first exemplary embodiment are denoted by the same reference numerals, and descriptions thereof are omitted or simplified.

In the second exemplary embodiment, a configuration example where the waveform shaping unit 210 and the cut-off unit 205 are composed of a logic circuit 203 including the cut-off unit 205 will be described.

Figure 9:
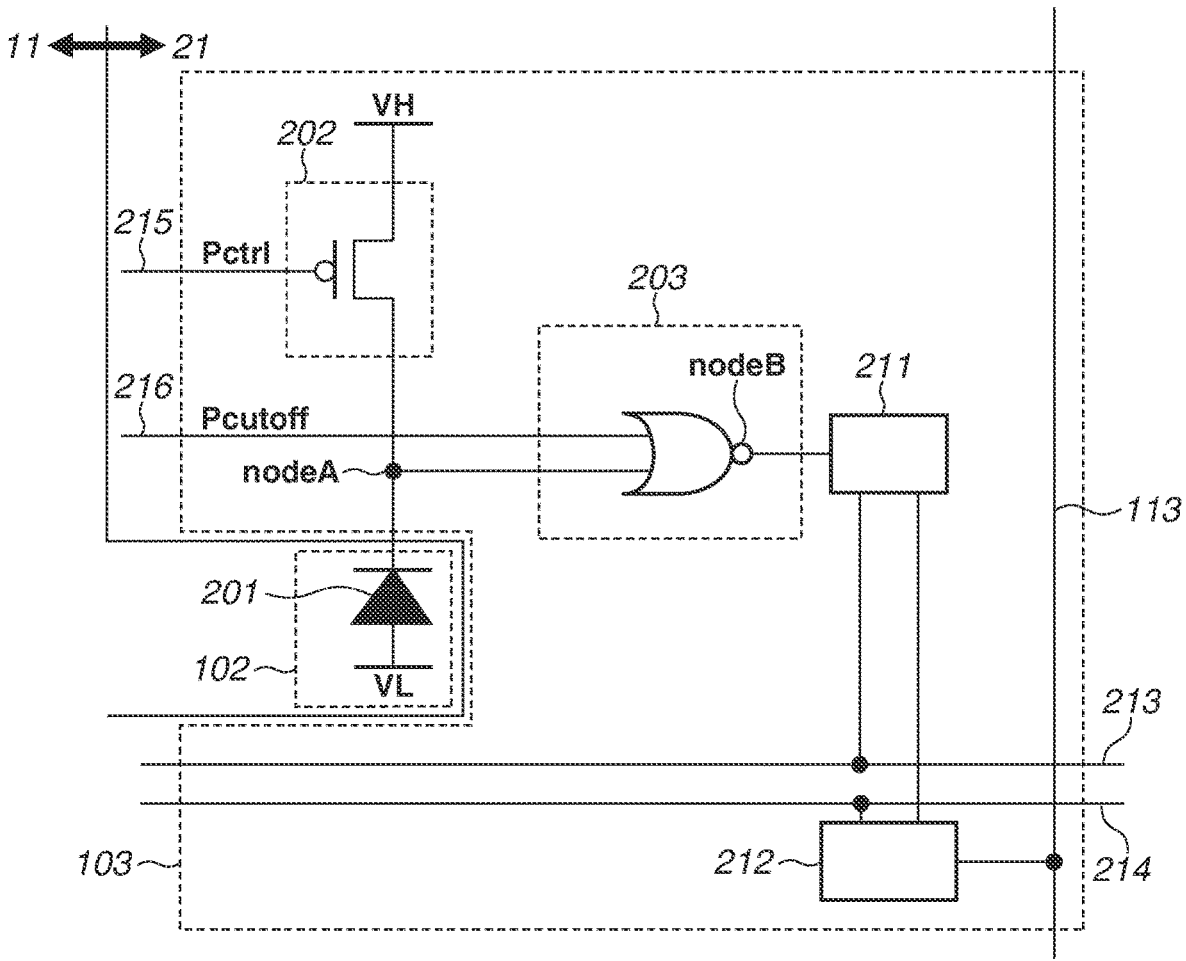
FIG. 9 is a logic circuit diagram illustrating one pixel of a sensor chip and a circuit chip of a photoelectric conversion device according to a second exemplary embodiment.
Figure 10:
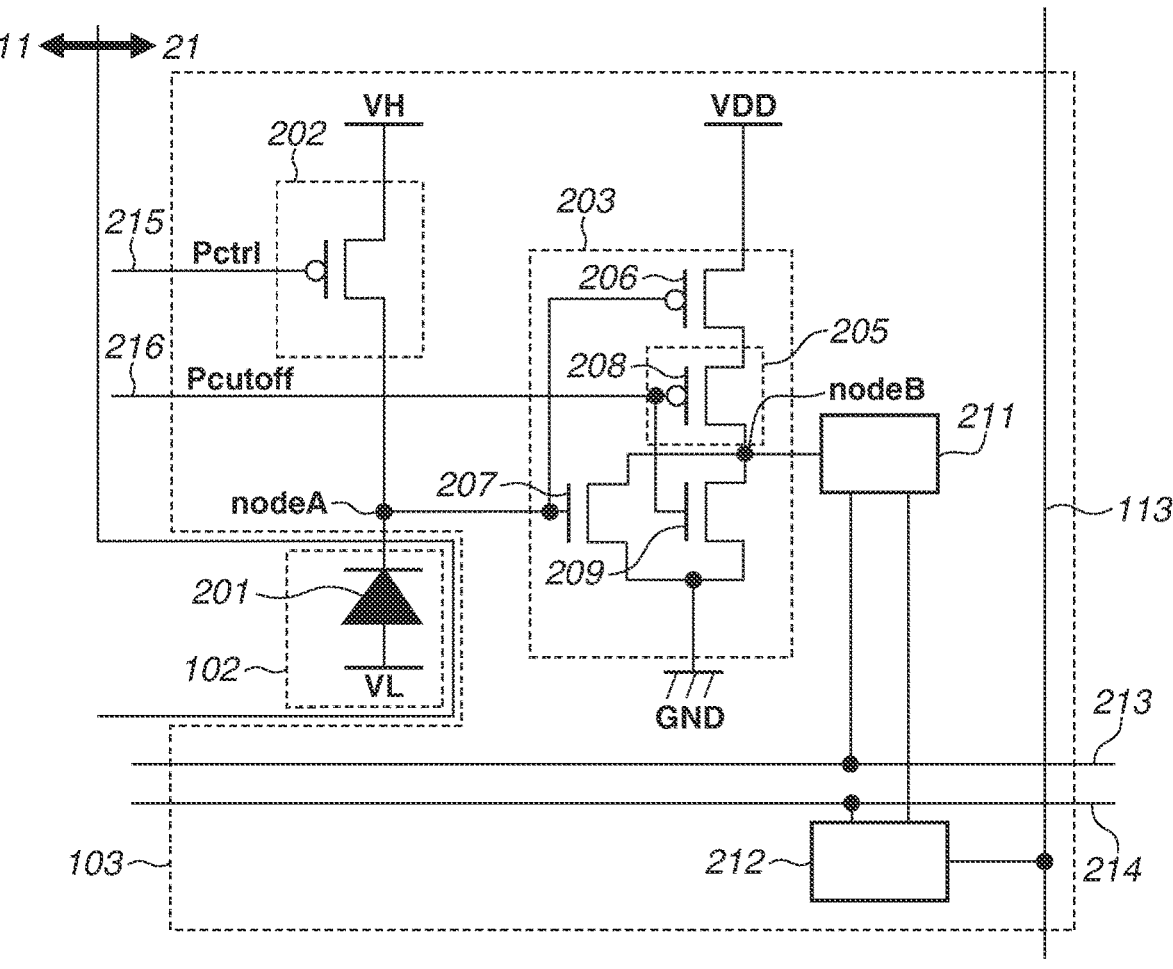
FIG. 10 is a block diagram corresponding to one pixel of the sensor chip and the circuit chip of the photoelectric conversion device according to the second exemplary embodiment.

FIGS. 9 and 10 are a logic circuit diagram and a block diagram, respectively, each including an equivalent circuit corresponding to one pixel illustrated in FIGS. 2 and 3 in the photoelectric conversion device according to the present exemplary embodiment.

As illustrated in FIG. 9, the logic circuit 203 is a NOR circuit having a configuration in which the node A corresponding to the cathode of the APD 201 and the second control line 216 are respectively connected to input terminals of the logic circuit 203 and an output terminal of the logic circuit 203 is connected to the counter circuit 211. FIG. 10 illustrates a specific configuration of the NOR circuit.

As illustrated in FIG. 10, the logic circuit 203 is composed of the first PMOS transistor 206, the second PMOS transistor 208, the first NMOS transistor 207, and a second NMOS transistor 209. The cut-off unit 205 is composed of the second PMOS transistor 208 and is included in the logic circuit 203.

In the example illustrated in FIG. 10, the source of the first PMOS transistor 206 is connected to VDD, and the source of the first NMOS transistor 207 is connected to GND. The drain of the first PMOS transistor 206 is connected to the source of the second PMOS transistor 208. The drain of the second PMOS transistor 208, the drain of the first NMOS transistor 207, and the drain of the second NMOS transistor 209 are connected. The source of the first NMOS transistor 207 is connected to the source of the second NMOS transistor 209.

An input terminal A, which is one of the input terminals constituting the NOR circuit, is controlled by the control signal Pcutoff, and the other input terminal B is controlled by the potential of the node A corresponding to the cathode of the APD 201. The cut-off unit 205 is in the conductive state when the potential of the input terminal A is at the low level, and the cut-off unit 205 is in the non-conductive state when the potential of the input terminal A is at the high level. When the potential of the input terminal A is at the high level, the output of the logic circuit is at the low level.

According to the present exemplary embodiment, the use of the logic circuit 203 (NOR circuit) including the cut-off unit 205 makes it possible to prevent the flow-through-current flowing through the waveform shaping unit (first PMOS transistor) 206 during the non-exposure period.

A photoelectric conversion device according to a third exemplary embodiment will now be described with reference to FIGS. 11 and 12. Components of the photoelectric conversion device according to the third exemplary embodiment that are similar to those of the photoelectric conversion device according to the first exemplary embodiment are denoted by the same reference numerals, and descriptions thereof are omitted or simplified.

In the present exemplary embodiment, a configuration example where the logic circuit 203 is composed of a NAND circuit will be described.

Figure 11:
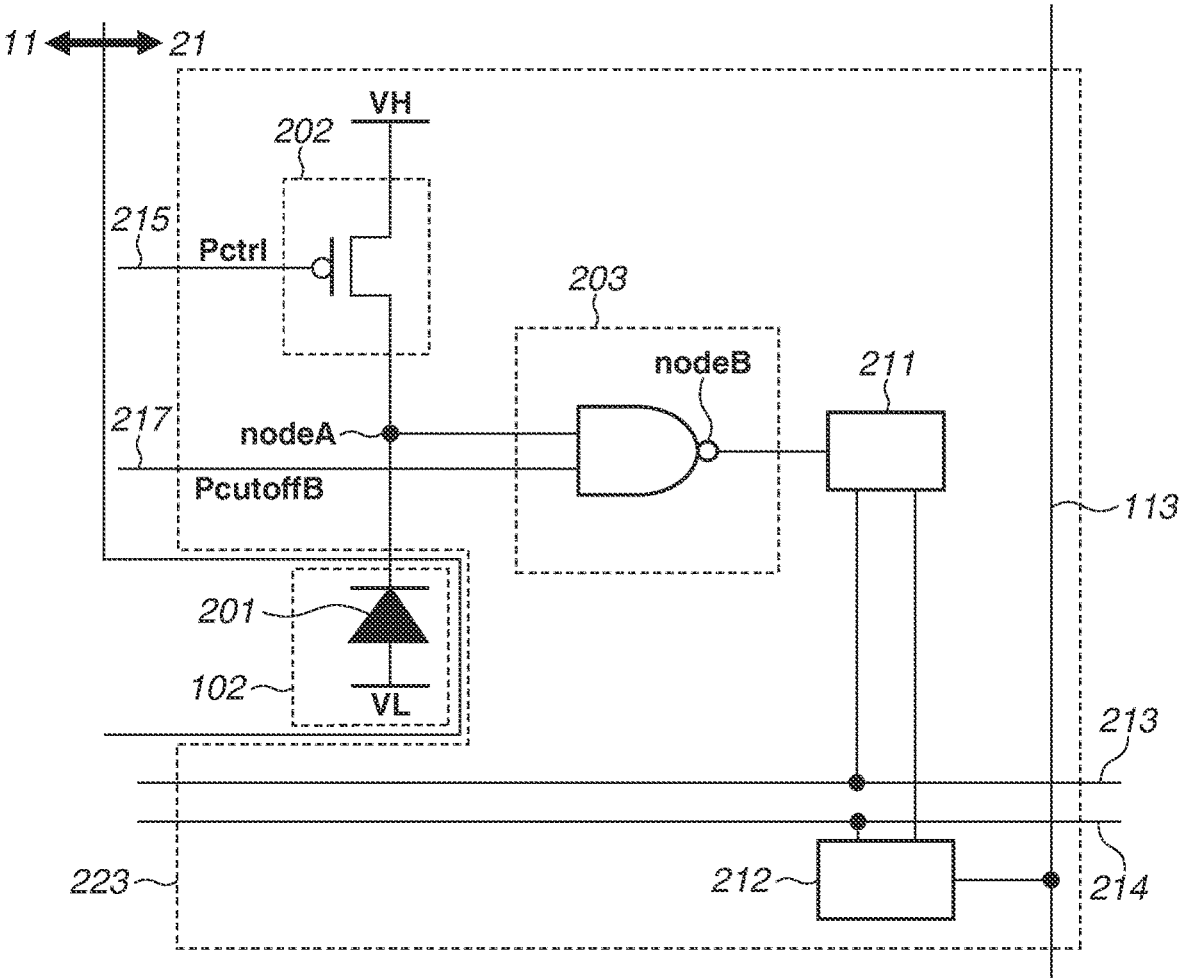
FIG. 11 is a logic circuit diagram illustrating one pixel of a sensor chip and a circuit chip of a photoelectric conversion device according to a third exemplary embodiment.
Figure 12:
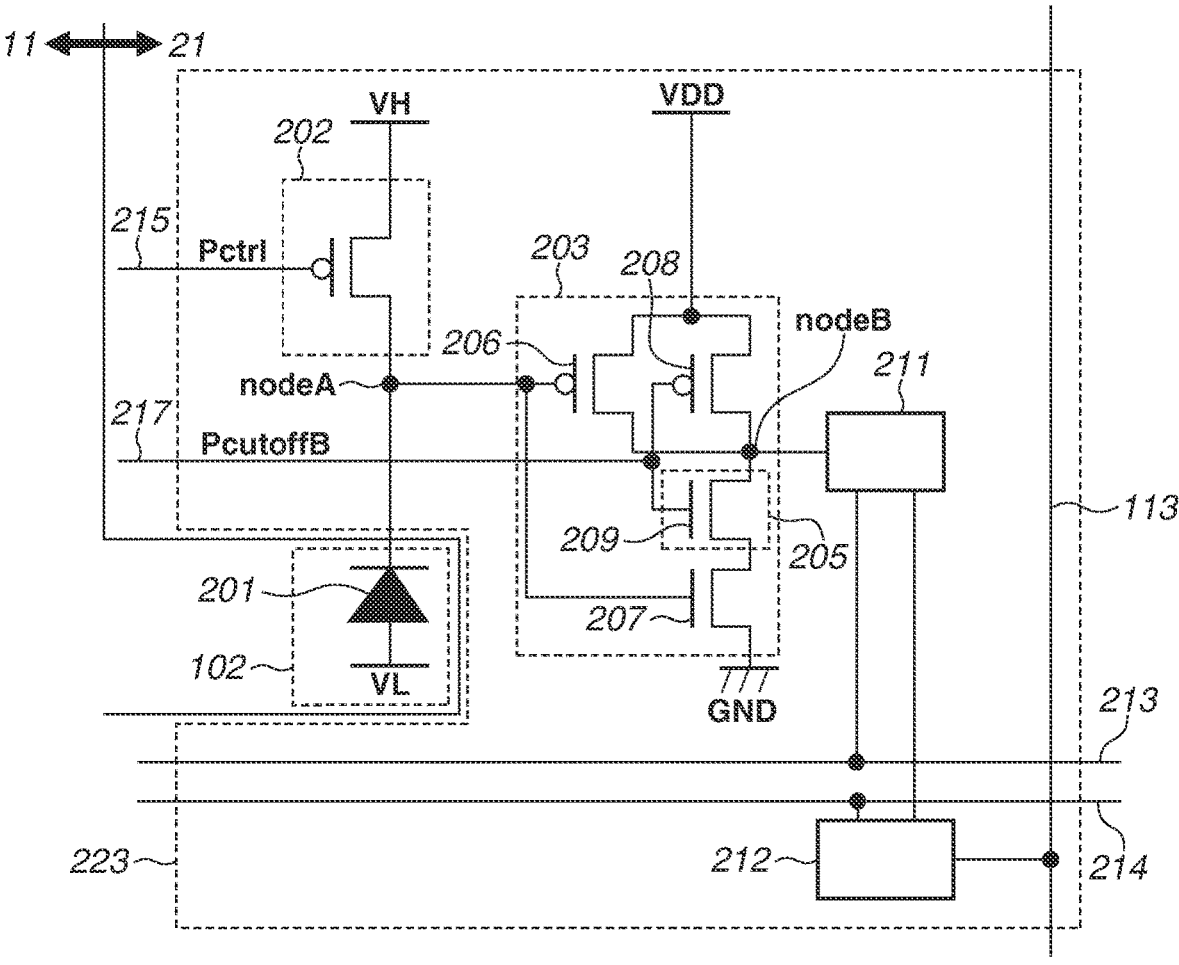
FIG. 12 is a block diagram corresponding to one pixel of the sensor chip and the circuit chip of the photoelectric conversion device according to the third exemplary embodiment.

FIGS. 11 and 12 are a logic circuit diagram and a block diagram, respectively, each including an equivalent circuit corresponding to one pixel illustrated in FIGS. 2 and 3 in the photoelectric conversion device according to the present exemplary embodiment.

As illustrated in FIG. 11, the logic circuit 203 functions as a NAND circuit having a configuration in which the node A corresponding to the cathode of the APD 201 and a third control line 217 are respectively connected to input terminals of the logic circuit 203, and an output terminal of the logic circuit 203 is connected to the counter circuit 211. FIG. 12 illustrates a specific configuration of the NAND circuit.

The logic circuit 203 is composed of the first PMOS transistor 206, the second PMOS transistor 208, the first NMOS transistor 207, and the second NMOS transistor 209. The cut-off unit 205 is composed of the second NMOS transistor 209 and is included in the logic circuit 203.

In the example illustrated in FIG. 12, the source of the first PMOS transistor 206 is connected to VDD, and the source of the first NMOS transistor 207 is connected to GND. The drain of the first PMOS transistor 206, the drain of the second PMOS transistor 208, and the drain of the second NMOS transistor 209 are connected. The source of the first PMOS transistor 206 is connected to the source of the second PMOS transistor 208. The drain of the first NMOS transistor 207 is connected to the source of the second NMOS transistor 209.

The input terminal A, which is one of the input terminals constituting the NAND circuit, is controlled by a control signal PcutoffB that is an inverted signal of the control signal Pcutoff. The other input terminal B is controlled by the potential of the node A corresponding to the cathode of the APD 201. The cut-off unit 205 is in the conductive state when the potential of the input terminal A is at the high level. The cut-off unit 205 is in the non-conductive state when the potential of the input terminal A is at the low level. When the potential of the input terminal A is at the low level, the output of the logic circuit is at the high level.

According to the present exemplary embodiment, the use of the logic circuit 203 (NAND circuit) including the cut-off unit 205 makes it possible to prevent the flow-through current from flowing through the waveform shaping unit 206 during the non-exposure period.

A photoelectric conversion device according to a fourth exemplary embodiment will now be described with reference to FIG. 13. Components of the photoelectric conversion device according to the fourth exemplary embodiment that are similar to those of the photoelectric conversion device according to the first exemplary embodiment are denoted by the same reference numerals, and descriptions thereof are omitted or simplified.

In the fourth exemplary embodiment, a configuration example where the logic circuit 203 is composed of a three-state buffer circuit will be described.

Figure 13:
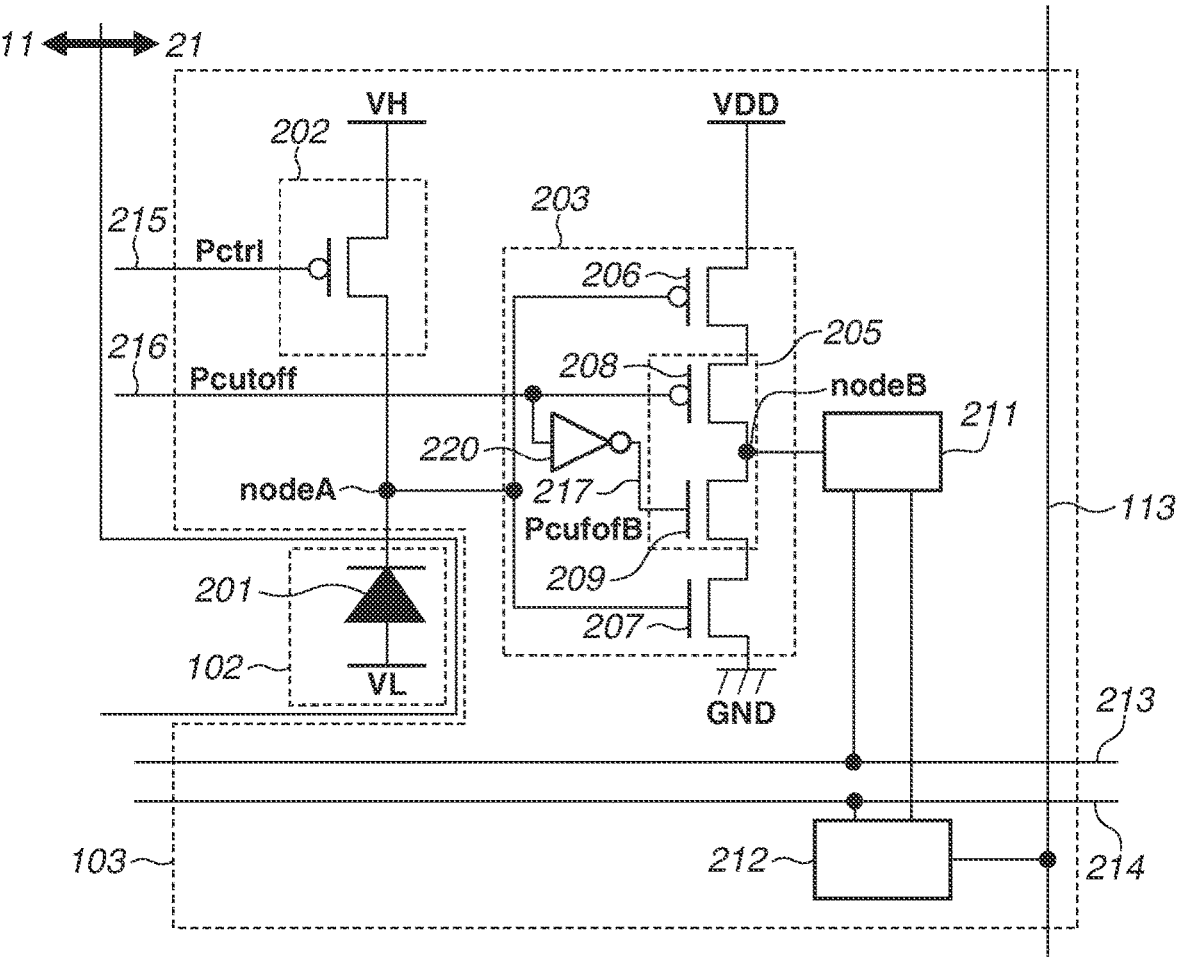
FIG. 13 is a block diagram corresponding to one pixel of a sensor chip and a circuit chip of a photoelectric conversion device according to a fourth exemplary embodiment.

FIG. 13 is a block diagram including an equivalent circuit corresponding to one pixel illustrated in FIGS. 2 and 3 according to the present exemplary embodiment.

An inverter circuit 220 receives the control signal Pcutoff and outputs the control signal PcutoffB serving as an inverted signal of the control signal Pcutoff. An input terminal of the inverter circuit 220 is connected to the control line 216 and an output terminal of the inverter circuit 220 is connected to the control line 217.

The logic circuit 203 is a three-state buffer circuit having a configuration in which the cathode of the APD 201, the second control line 216, and the third control line 217 are connected to input terminals of the logic circuit 203, and an output terminal of the logic circuit 203 is connected to the counter circuit 211. The cut-off unit 205 included in the logic circuit 203 is composed of the second PMOS transistor 208 and the second NMOS transistor 209.

In the example illustrated in FIG. 13, the source of the first PMOS transistor 206 is connected to VDD, and the source of the first NMOS transistor 207 is connected to GND. The drain of the first PMOS transistor 206 is connected to the source of the second PMOS transistor 208, and the drain of the first NMOS transistor 207 is connected to the source of the second NMOS transistor 209. The drain of the second PMOS transistor 208 is connected to the drain of the second NMOS transistor 209.

An input terminal A, which is one of the input terminals constituting the three-state buffer circuit, is controlled by the control signal Pcutoff, and the other input terminal B is controlled by the potential of the node A corresponding to the cathode of the APD 201. The cut-off unit 205 is in the conductive state when the potential of the input terminal A is at the low level, and the cut-off unit 205 is in the non-conductive state when the potential of the input terminal A is at the high level. According to the operation of the three-state buffer circuit, the electrical path between the power supply VDD and GND is cut off and the output of the three-state buffer circuit becomes a high impedance.

According to the present exemplary embodiment, the use of the logic circuit 203 (three-state buffer circuit) including the cut-off unit 205 makes it possible to prevent the flow-through current from flowing through the waveform shaping unit 206 during the non-exposure period.

A photoelectric conversion device according to a fifth exemplary embodiment will now be described with reference to FIGS. 14 and 15. Components of the photoelectric conversion device according to the fifth exemplary embodiment that are similar to those of the photoelectric conversion device according to the first exemplary embodiment are denoted by the same reference numerals, and descriptions thereof are omitted or simplified.

In the fifth exemplary embodiment, an example of a drive timing when the logic circuit 203 is composed of a NOR circuit will be described.

Figure 14:
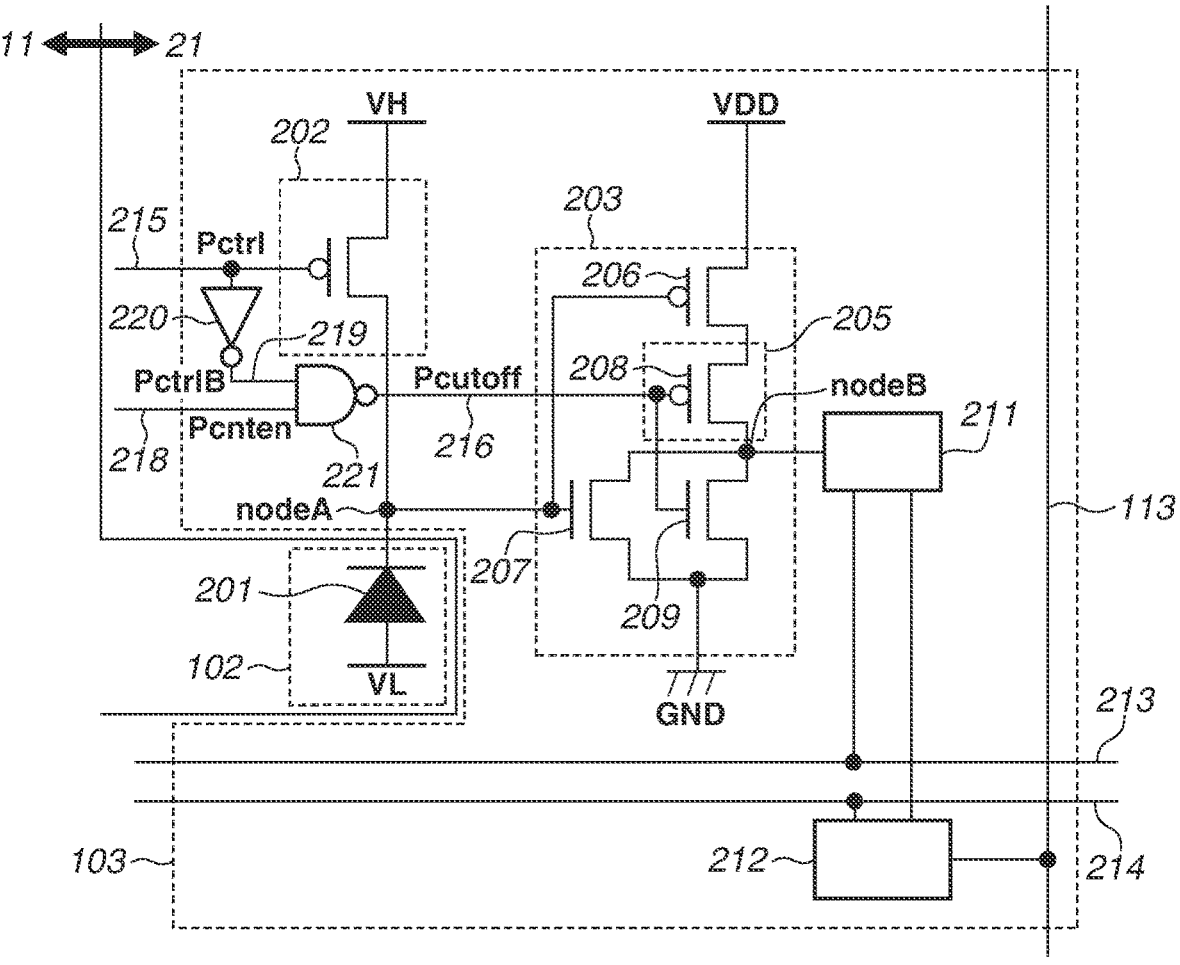
FIG. 14 is a block diagram corresponding to one pixel of a sensor chip and a circuit chip of a photoelectric conversion device according to a fifth exemplary embodiment.

FIG. 14 is a block diagram including an equivalent circuit of one pixel illustrated in FIGS. 2 and 3 according to the present exemplary embodiment.

Each pixel of the photoelectric conversion device according to the present exemplary embodiment has a configuration in which the inverter circuit 220 and a NAND circuit 221 are added to the configuration of each pixel in the photoelectric conversion device according to the second exemplary embodiment.

The inverter circuit 220 receives the control signal Pctrl and outputs a control signal PctrlB as an inverted signal of the control signal Pctrl. The inverter circuit 220 has a configuration in which the first control line 215 is connected to an input terminal of the inverter circuit 220 and a fifth control line 219 is connected to an output terminal of the inverter circuit 220. The control signal PctrlB is input to the inverter circuit 220 via the fifth control line 219.

The NAND circuit 221 receives a control signal Pcnten and the control signal PctrlB, and outputs the control signal Pcutoff. A fourth control line 218 and the fifth control line 219 are connected to input terminals of the NAND circuit 221, and the control signal Pcutoff is connected to an output terminal of the NAND circuit 221. The control signal Pcnten is input to the NAND circuit 221 via the fourth control line 218. The control signal PctrlB is input to the NAND circuit 221 via the fifth control line 219.

The control signal Pcnten controls the enabled/disabled state of the input to the counter circuit 211. When the control signal Pcnten is at the high level, the input to the counter circuit 211 varies depending on the incidence of a photon and the control line signal Pctrl. Accordingly, the input to the counter circuit 211 is enabled to thereby enable a counting operation. In contrast, when the control signal Pcnten is at the low level, the input to the counter circuit 211 is fixed at the low level. Accordingly, the input to the counter circuit 211 is disabled, so that the counter circuit 211 does not perform the counting operation. For example, when the control signal Pcnten is at the high level, the exposure period starts, and when the control signal Pcnten is at the low level, the non-exposure period starts.

Figure 15:
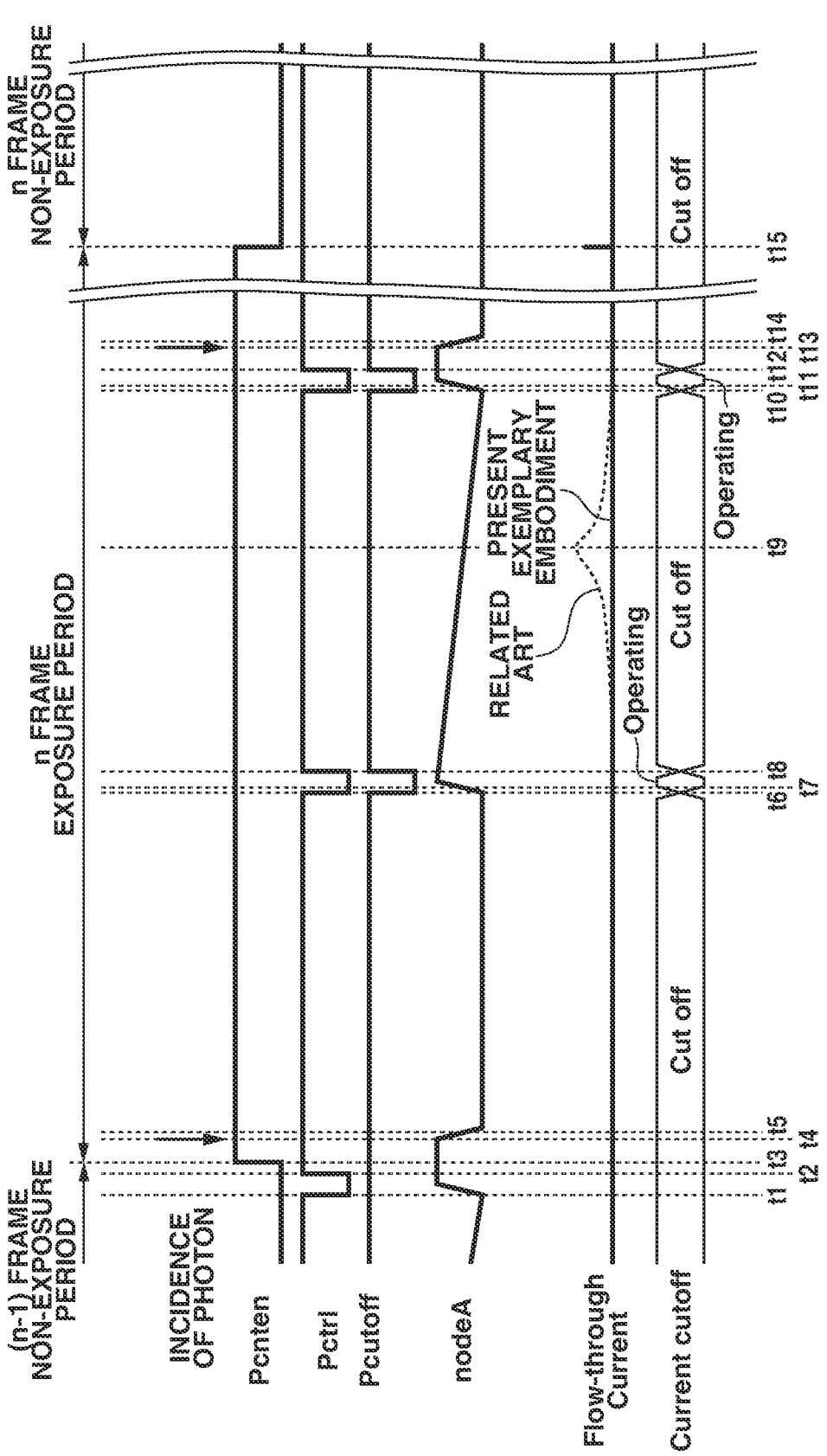
FIG. 15 is a drive timing diagram of one pixel of a photoelectric conversion device according to the fifth exemplary embodiment.

FIG. 15 is an example of a drive timing diagram of one pixel according to the present exemplary embodiment. A period from time t1 to time t3 corresponds to the non-exposure period of the (n−1)-frame. A period from time t3 to time t15 corresponds to the exposure period of the n-frame. A period after time t15 corresponds to the non-exposure period of the n-frame.

At time t1, the control signal Pctrl transitions from the high level to the low level, so that the switch 202 is turned on and the APD 201 transitions to the recharging state. Thereafter, the potential of the node A settles at the potential level at which avalanche multiplication is possible.

At time t2, the control signal Pctrl transitions from the low level to the high level, so that the switch 202 is turned off and the APD 201 transitions to the standby state.

At time t3, the control signal Pcnten transitions from the low level to the high level, and the input to the counter circuit 211 is enabled.

At time t4, a photon is incident on the APD 201, so that the avalanche multiplication current flows and the voltage of the node A drops.

At time t5, the potential of the node A exceeds the determination threshold of the logic circuit 203.

At time t6, the control signal Pctrl transitions from the high level to the low level, so that the switch 202 is turned on and the APD 201 transitions to the recharging state. Further, the control signal Pcutoff transitions from the high level to the low level, and the cut-off unit 205 transitions to the operating state.

At time t7, the signal at the node A exceeds the determination threshold of the logic circuit 203. At this time, the flow-through current flows to GND from the power supply VDD. Thereafter, the potential of the node A settles at the potential level at which avalanche multiplication is possible.

At time t8, the control signal Pctrl transitions from the low level to the high level, so that the switch 202 is turned off and the APD 201 transitions to the standby state. Further, the control signal Pcutoff transitions from the low level to the high level and the cut-off unit 205 transitions to the cut-off state. Thus, the node A is floating. If the node A is floating for a long period of time, the potential of the node A decreases due to a reverse current generated in the APD 201 even during the exposure period.

At time t9, the signal at the node A exceeds the determination threshold of the logic circuit 203. At this time, the potential of the node A is held at the intermediate potential of transistors constituting the subsequent-stage logic circuit 203. In the present exemplary embodiment, the cut-off unit 205 is in the cut-off state even during the exposure period, which prevents the generation of the flow-through current.

At time t10, the control signal Pctrl transitions from the high level to the low level, so that the switch 202 is turned on and the APD 201 transitions to the recharging state. Further, the control signal Pcutoff transitions from the high level to the low level and the cut-off unit 205 transitions to the operating state.

At time t11, the signal at the node A exceeds the determination threshold of the logic circuit 203. At this time, the flow-through current flows to GND from the power supply VDD. Thereafter, the node A corresponding to the cathode of the APD 201 settles at the potential level at which avalanche multiplication is possible.

At time t12, the control signal Pctrl transitions from the low level to the high level, so that the switch 202 is turned off and the APD 201 transitions to the standby state. Further, the control signal Pcutoff transitions from the low level to the high level, and the cut-off unit 205 transitions to the cut-off state. Thus, the node A is floating.

At time t13, a photon is incident on the APD 201, so that the avalanche multiplication current flows and the voltage of the node A drops.

At time t14, the signal at the node A exceeds the determination threshold of the logic circuit 203.

At time t15, the control signal Pcnten transitions from the high level to the low level, and the input to the counter circuit 211 is disabled.

According to the present exemplary embodiment as described above, the logical operation between the control signal Pctrl and the control signal Pcnten makes it possible to prevent, during the exposure period, the flow-through current from flowing through the waveform shaping unit 206 when the cathode is floating.

FIG. 15 illustrates an example of the drive timing diagram in which the cut-off unit 205 transitions to the cut-off state when the control signal Pctrl transitions to the high level, the switch 202 is turned off, and the APD 210 transitions to the standby state during the exposure period. The drive timing is not limited to this example. For example, the switch 202 may be controlled to the standby state when the count value of the counter circuit 211 is maximum.

Figure 16:
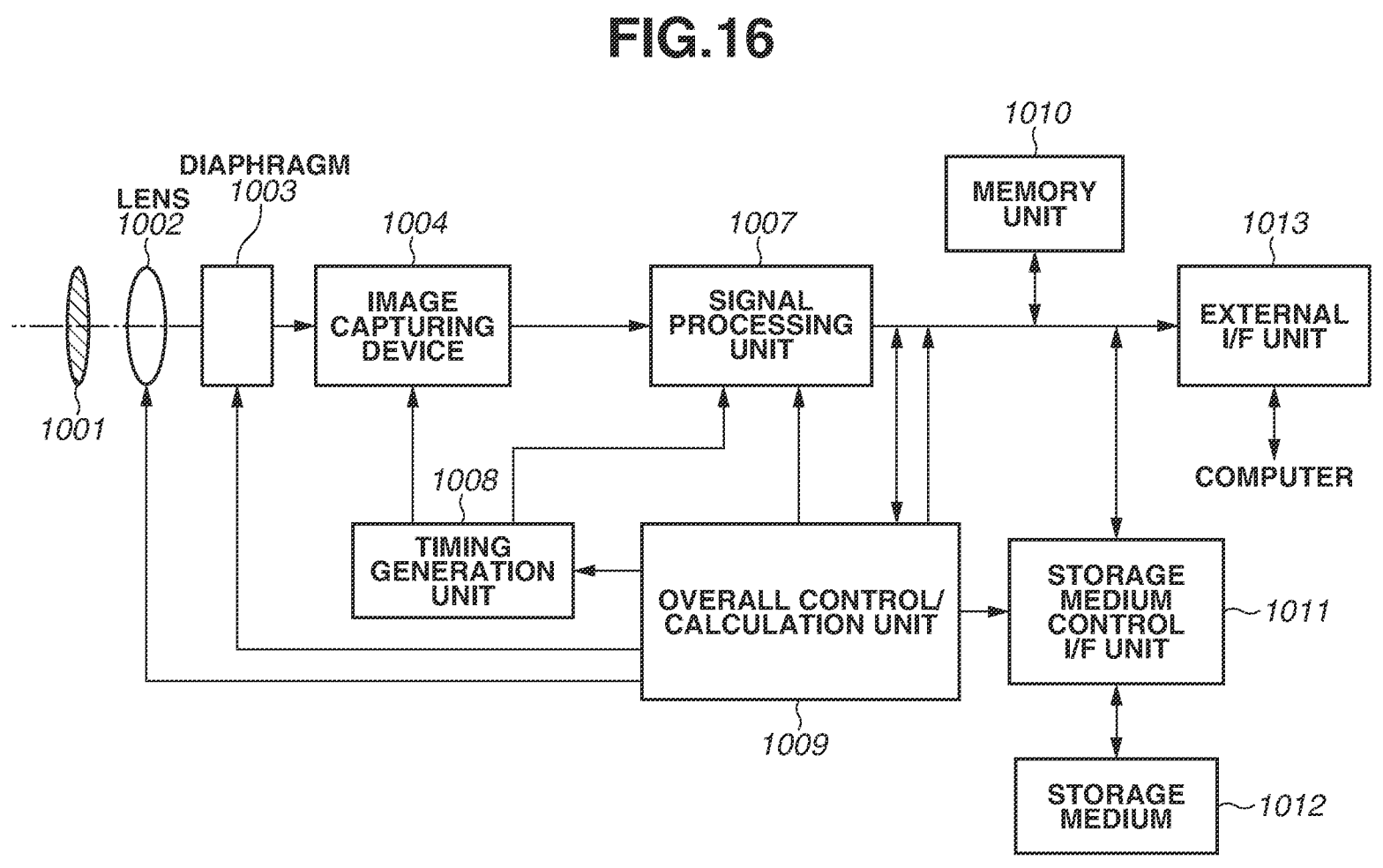

A photoelectric conversion system according to a sixth exemplary embodiment will now be described with reference to FIG. 16. FIG. 16 is a block diagram schematically illustrating a configuration example of the photoelectric conversion system according to the sixth exemplary embodiment.

The photoelectric conversion devices according to the first to fifth exemplary embodiments can be applied to various photoelectric conversion systems. Examples of various applicable photoelectric conversion systems include digital still cameras, digital camcorders, monitoring cameras, copying machines, facsimile machines, mobile phones, in-vehicle cameras, and observation satellites. The various applicable photoelectric conversion systems also include camera modules including an optical system such as a lens and an image capturing device. FIG. 16 is a block diagram illustrating a digital still camera as an example of such photoelectric conversion systems.

The photoelectric conversion system illustrated in FIG. 16 includes an image capturing device 1004, which is an example of the photoelectric conversion device, and a lens 1002 that forms an optical image of a subject on the image capturing device 1004. The photoelectric conversion system further includes a diaphragm 1003 configured to change the amount of light that passes through the lens 1002, and a barrier 1001 for protecting the lens 1002. The lens 1002 and the diaphragm 1003 are optical systems that focus light on the image capturing device 1004. The image capturing device 1004 is any one of the photoelectric conversion devices according to the above-described exemplary embodiments, and converts an optical image formed by the lens 1002 into an electric signal.

The photoelectric conversion system further includes a signal processing unit 1007 as an image generation unit to generate an image by performing processing on an output signal output from the image capturing device 1004. The signal processing unit 1007 performs various correction and compression operations, as needed, and outputs image data. The signal processing unit 1007 may be formed on a semiconductor substrate on which the image capturing device 1004 is provided or may be formed on a semiconductor substrate different from the semiconductor substrate on which the image capturing device 1004 is provided.

The photoelectric conversion system further includes a memory unit 1010 for temporarily storing image data, and an external interface (I/F) unit 1013 for communicating with an external computer or the like. The photoelectric conversion system further includes a storage medium 1012, such as a semiconductor memory, for storing or reading out captured image data, and a storage medium control I/F unit 1011 for storing data in the storage medium 1012 or reading out data from the storage medium 1012. The storage medium 1012 may be incorporated in the photoelectric conversion system or may be detachably attached to the photoelectric conversion system.

The photoelectric conversion system further includes an overall control/calculation unit 1009 that controls various calculations and the overall operation of the digital still camera, and a timing generation unit 1008 that outputs various timing signals to each of the image capturing device 1004 and the signal processing unit 1007. The timing signals and the like may be input from an external device. The photoelectric conversion system may desirably include at least the image capturing device 1004 and the signal processing unit 1007 that processes the output signal output from the image capturing device 1004.

The image capturing device 1004 outputs an image capturing signal to the signal processing unit 1007. The signal processing unit 1007 performs predetermined signal processing on the image capturing signal output from the image capturing device 1004, and outputs image data. The signal processing unit 1007 generates an image using the image capturing signal.

According to the present exemplary embodiment, it is possible to achieve the photoelectric conversion system to which the photoelectric conversion device (image capturing device) according to any one of the above-described exemplary embodiments is applied.

Figures 17A, 17B:
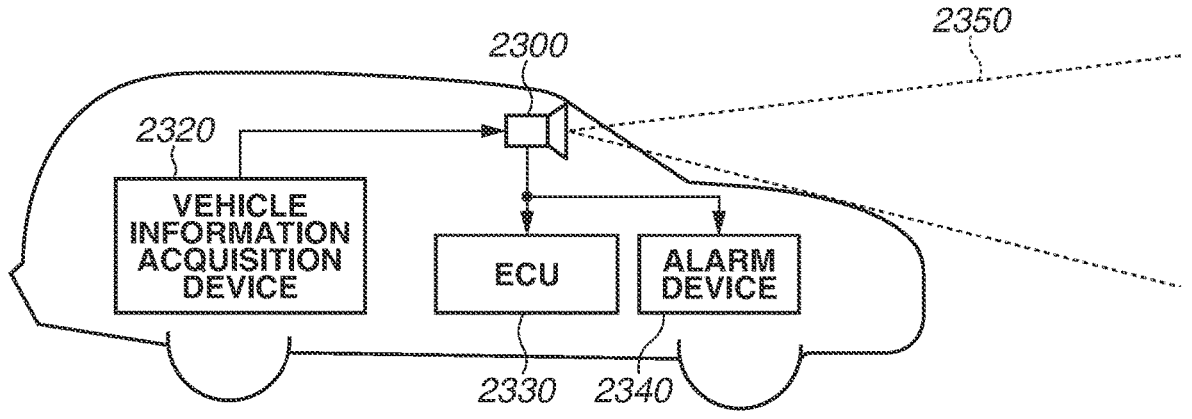
FIG. 17A is a functional block diagram of a photoelectric conversion system according to a seventh exemplary embodiment.
FIG. 17B is a functional block diagram of the photoelectric conversion system according to the seventh exemplary embodiment.

A photoelectric conversion system and a moving body according to a seventh exemplary embodiment will now be described with reference to FIGS. 17A and 17B. FIG. 17A is a block diagram illustrating a configuration example of the photoelectric conversion system according to the seventh exemplary embodiment. FIG. 17B is a block diagram illustrating a configuration example of the moving body according to the seventh exemplary embodiment.

FIG. 17A illustrates an example of the photoelectric conversion system for an in-vehicle camera. A photoelectric conversion system 2300 includes an image capturing device 2310. The image capturing device 2310 is any one of the photoelectric conversion devices according to the exemplary embodiments described above. The photoelectric conversion system 2300 includes an image processing unit 2312 that performs image processing on a plurality of pieces of image data acquired by the image capturing device 2310, and a parallax acquisition unit 2314 that calculates a parallax (phase difference between parallax images) based on the plurality of pieces of image data acquired by the photoelectric conversion system 2300. The photoelectric conversion system 2300 further includes a distance measurement unit 2316 that calculates a distance to an object based on the calculated parallax, and a collision determination unit 2318 that determines whether there is a possibility of collision based on the calculated distance. The parallax acquisition unit 2314 and the distance measurement unit 2316 are examples of a distance information acquisition unit that acquires distance information indicating a distance to a target object. Specifically, the distance information indicates information about a parallax, a defocus amount, a distance to a target object, and the like. The collision determination unit 2318 may determine the possibility of collision using any one of the pieces of distance information. The distance information acquisition unit may be implemented by an exclusively designed hardware or software module.

Alternatively, the distance information acquisition unit may be implemented by using, for example, a field-programmable gate array (FPGA), an application-specific integrated circuit (ASIC), or a combination thereof.

The photoelectric conversion system 2300 is connected to a vehicle information acquisition device 2320 and is configured to acquire vehicle information, such as a vehicle speed, a yaw rate, and a steering angle. The photoelectric conversion system 2300 is also connected to an engine control unit (ECU) 2330 serving as a control unit that outputs a control signal for generating a braking force for a vehicle based on the determination result from the collision determination unit 2318. The photoelectric conversion system 2300 is also connected to an alarm device 2340 that issues an alarm to a driver based on the determination result from the collision determination unit 2318. For example, in a case where there is a high possibility of collision based on the determination result from the collision determination unit 2318, the ECU 2330 performs a vehicle control operation to avoid a collision or reduce damage by, for example, applying brakes, releasing a gas pedal, or reducing engine power. The alarm device 2340 issues a warning to a user by, for example, generating an alarm sound, displaying warning information on a screen of a navigation system, or applying vibrations to a seat belt or a steering wheel.

In the present exemplary embodiment, the photoelectric conversion system 2300 captures images of an area around the vehicle, such as the front side or the rear side of the vehicle. FIG. 17B illustrates the photoelectric conversion system 2300 in a case where an image of the front side of the vehicle (an imaging range 2350) is captured. The vehicle information acquisition device 2320 sends an instruction to the photoelectric conversion system 2300 or the image capturing device 2310. Such a configuration can further improve the accuracy of ranging.

While an example of the control operation for avoiding a collision with another vehicle is described above, the present exemplary embodiment is also applicable to, for example, a control operation for automated driving to follow another vehicle, a control operation for automated driving not to deviate from a traffic lane. The photoelectric conversion system 2300 is not limited to a vehicle, such as an automobile, and is also applicable to, for example, a moving body (traveling apparatus), such as a ship, an airplane, or an industrial robot. The photoelectric conversion system 2300 is applicable not only to a moving body, but also to an apparatus that widely uses object recognition techniques, such as an intelligent transport system (ITS).

A photoelectric conversion system according to an eighth exemplary embodiment will now be described with reference to FIG. 18. FIG. 18 is a block diagram illustrating a configuration example of a distance image sensor as an example of the photoelectric conversion system according to the present exemplary embodiment.

As illustrated in FIG. 18, a distance image sensor 401 includes an optical system 402, a photoelectric conversion device 403, an image processing circuit 404, a monitor 405, and a memory 406. A light source device 411 projects light toward a subject, and the distance image sensor 401 receives light (modulated light or pulse light) reflected on the surface of the subject, thereby obtaining a distance image corresponding to the distance to the subject.

The optical system 402 includes one or more lenses. The optical system 402 guides image light (incident light) from the subject to the photoelectric conversion device 403 and forms an image on a light-receiving surface (sensor portion) of the photoelectric conversion device 403.

The photoelectric conversion device according to any one of the exemplary embodiments described above can be used as the photoelectric conversion device 403. A distance signal indicating the distance obtained based on the received light signal output from the photoelectric conversion device 403 is supplied to the image processing circuit 404.

The image processing circuit 404 performs image processing to form the distance image based on the distance signal supplied from the photoelectric conversion device 403. The distance image (image data) obtained by the image processing is supplied to be displayed on the monitor 405 or supplied to be stored (recorded) in the memory 406.

The distance image sensor 401 having a configuration as described above can acquire, for example, a more accurate distance image with an improvement in pixel characteristics by applying any of the photoelectric conversion devices according to the exemplary embodiments described above.

Figure 19:
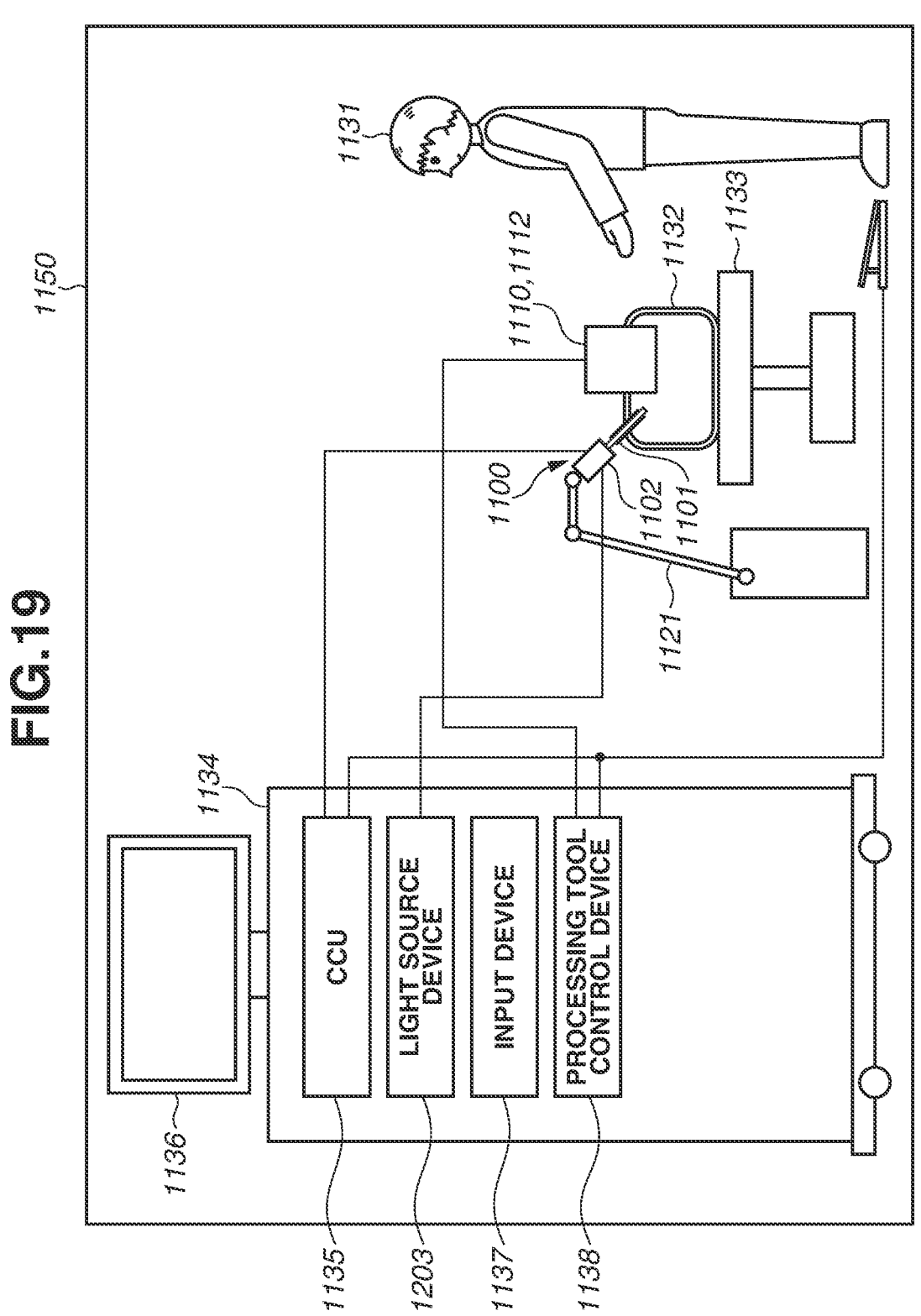
FIG. 19 is a functional block diagram of a photoelectric conversion system according to a ninth exemplary embodiment.

A photoelectric conversion system according to a ninth exemplary embodiment will now be described with reference to FIG. 19. FIG. 19 illustrates an example of a schematic configuration of an endoscopic surgery system as an example of the photoelectric conversion system according to the present exemplary embodiment.

FIG. 19 illustrates a state where an operator (doctor) 1131 performs a surgery on a patient 1132 on a patient bed 1133 using an endoscopic surgery system 1150. As illustrated in FIG. 19, the endoscopic surgery system 1150 includes an endoscope 1100, a surgical instrument 1110, and a cart 1134 on which various devices for endoscopic surgery are placed.

The endoscope 1100 includes a lens barrel 1101 and a camera head 1102. A region of the endoscope 1100 at a predetermined length from a distal end thereof is inserted into the body cavity of the patient 1132. The camera head 1102 is connected to a proximal end of the lens barrel 1101. In the illustrated example, the endoscope 1100 is configured as a so-called hard mirror including the hard lens barrel 1101. Alternatively, the endoscope 1100 can be configured as a so-called soft mirror including a soft lens barrel.

The distal end of the lens barrel 1101 is provided with an opening into which an objective lens is fit. A light source device 1203 is connected to the endoscope 1100. Light generated by the light source device 1203 is guided to the distal end of the lens barrel 1101 by a light guide extending in the lens barrel 1101, and the light is radiated toward an observation target within the body cavity of the patient 1132 through the objective lens. The endoscope 1100 may be a forward-viewing endoscope, an oblique-viewing endoscope, or a side-viewing endoscope.

An optical system and a photoelectric conversion device are provided within the camera head 1102 and reflected light (observation light) from the observation target is focused on the photoelectric conversion device by the optical system. The observation light is photoelectrically converted by the photoelectric conversion device, thereby generating an electric signal corresponding to the observation light, or an image signal corresponding to the observation light. Any one of the photoelectric conversion devices according to the above-described exemplary embodiments can be used as the photoelectric conversion device. The image signal is transmitted as raw data to a camera control unit (CCU) 1135.

The CCU 1135 is composed of a central processing unit (CPU), a graphics processing unit (GPU), or the like, and the CCU 1135 controls operations of the endoscope 1100 and a display device 1136 in an integrated manner. The CCU 1135 receives an image signal from the camera head 1102 and performs various image processing for displaying an image based on the image signal, such as development processing (demosaicing processing), on the image signal.

The display device 1136 displays an image based on the image signal on which image processing is performed by the CCU 1135 under control of the CCU 1135.

The light source device 1203 is composed of a light source, such as a light-emitting diode (LED), and supplies irradiated light to the endoscope 1100 when an image of a surgery site or the like is captured.

An input device 1137 is an input I/F for the endoscopic surgery system 1150. The user can input various information and instructions to the endoscopic surgery system 1150 through the input device 1137.

A processing tool control device 1138 controls driving of an energy processing tool 1112 for cauterization or incision of a tissue, blood vessel sealing, or the like.

The light source device 1203 that supplies irradiation light to the endoscope 1100 when an image of a surgery site is captured can be composed of, for example, a white light source formed of an LED, a laser light source, or a combination thereof. If the white light source is formed of a combination of RGB laser light sources, an output intensity and an output timing of each color (each wavelength) can be accurately controlled. Thus, the light source device 1203 can adjust the white balance of the captured image. In this case, laser light from each of the RGB laser light sources is radiated to the observation target by time division, and driving of an image sensor of the camera head 1102 is controlled in synchronization with the irradiation timing, thereby making it possible to capture images respectively corresponding to RGB laser light beams by time division. According to this method, a color image can be obtained without providing any color filter in the image sensor.

Driving of the light source device 1203 may be controlled such that the intensity of light to be output is changed at predetermined time intervals. By driving the image sensor of the camera head 1102 controlled in synchronization with the timing of changing the light intensity to obtain images by time division and combine the images, it is possible to form an image with a high dynamic range without causing a so-called black underexposure picture image and whiteout.

The light source device 1203 may be configured to supply light in a predetermined wavelength band corresponding to a special light observation. In the special light observation, for example, the wavelength dependence of absorption of light in a body tissue is used. Specifically, an image of a predetermined tissue, such as a blood vessel on a mucous surface, is captured with a high contrast by radiating light with a bandwidth narrower than that of irradiated light (i.e., white light) in a normal observation.

Alternatively, in the special light observation, a fluorescent observation for obtaining an image by fluorescence generated by radiating excitation light may be performed. In the fluorescent observation, for example, it is possible to observe fluorescence from a body tissue by radiating excitation light to the body tissue or obtain a fluorescence image by locally injecting reagent such as indocyanine green (ICG) into a body tissue and radiating excitation light corresponding to the fluorescence wavelength of the reagent to the body tissue. The light source device 1203 may be configured to supply narrow-band light and/or excitation light compatible with the special light observation.

Figure 20A:
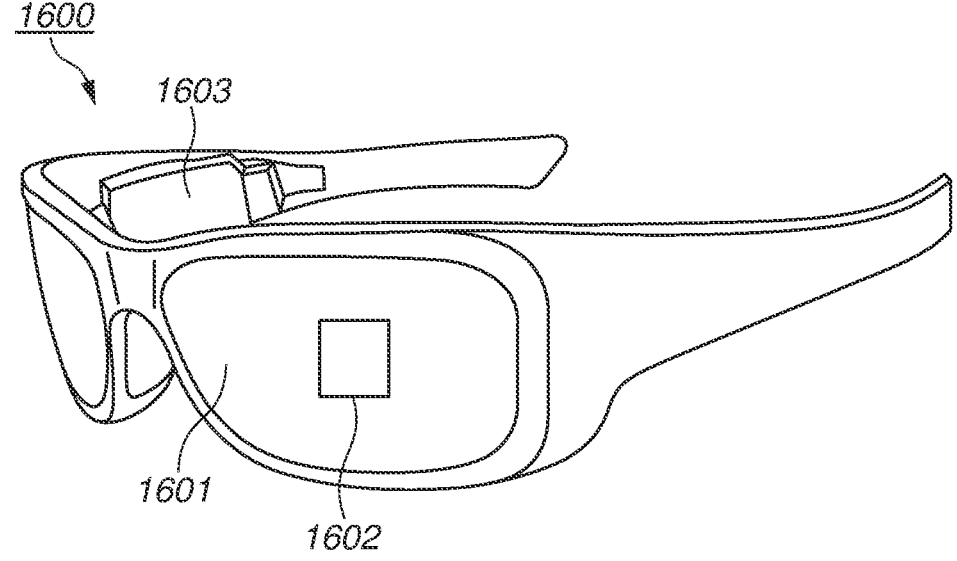
FIG. 20A is a functional block diagram of a photoelectric conversion system according to a tenth exemplary embodiment.

A photoelectric conversion system according to a tenth exemplary embodiment will now be described with reference to FIGS. 20A and 20B. FIG. 20A illustrates eyeglasses 1600 (smart glasses) as an example of the photoelectric conversion system according to the present exemplary embodiment. The eyeglasses 1600 include a photoelectric conversion device 1602. The photoelectric conversion device 1602 is any one of the photoelectric conversion devices according to the above-described exemplary embodiments. A display device including a light-emitting device, such as an organic LED (OLED) or an LED, may be provided on the back surface of a lens 1601. One or more photoelectric conversion devices 1602 may be provided. A combination of various types of photoelectric conversion devices may be used. One or more photoelectric conversion devices 1602 may be provided. Various types of photoelectric conversion devices may be used in combination. The layout position of the photoelectric conversion device 1602 is not limited to that illustrated in FIG. 20A.

The eyeglasses 1600 further include a control device 1603. The control device 1603 functions as a power supply for supplying power to each of the photoelectric conversion device 1602 and the above-described display device. The control device 1603 controls operations of the photoelectric conversion device 1602 and the display device. The lens 1601 is provided with an optical system for focusing light on the photoelectric conversion device 1602.

Figure 20B:
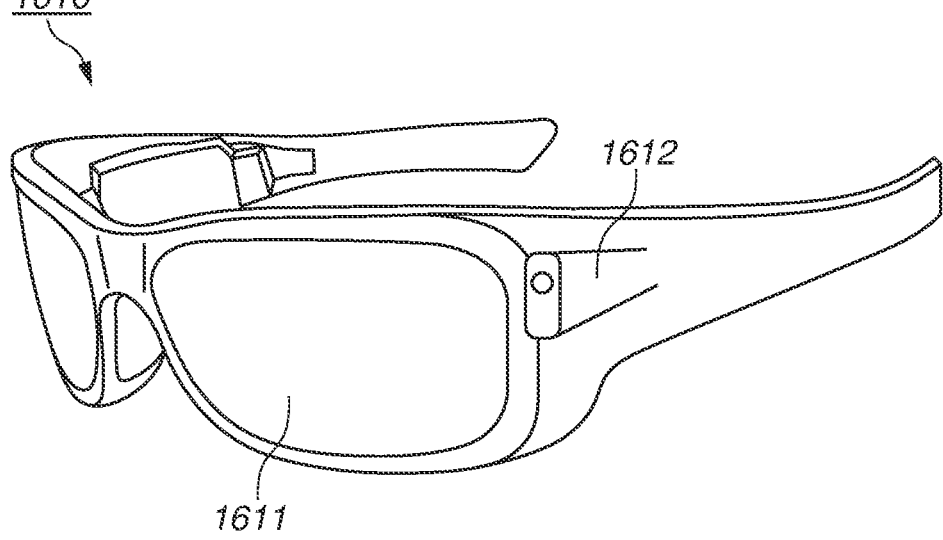
FIG. 20B is a functional block diagram of a photoelectric conversion system according to the tenth exemplary embodiment.

FIG. 20B illustrates eyeglasses 1610 (smart glasses) as an application example. The eyeglasses 1610 include a control device 1612. A photoelectric conversion device corresponding to the photoelectric conversion device 1602 and a display device are incorporated in the control device 1612. The lens 1611 is provided with the photoelectric conversion device in the control device 1612, and with an optical system for projecting light emitted from the display device. An image is projected on the lens 1611. The control device 1612 functions as a power supply to supply power to each of the photoelectric conversion device and the display device, and controls operations of the photoelectric conversion device and the display device. The control device 1612 may include a line-of-sight detection unit that detects the line of sight of a wearer. An infrared ray may be used to detect the line of sight. An infrared light-emitting unit emits infrared light to an eyeball of the user who is gazing at a display image. Reflected light of the emitted infrared light from the eyeball is detected by an image capturing unit including a light-receiving element, thereby obtaining a captured image of the eyeball. Provision of a reduction unit to reduce light from the infrared light-emitting unit to the display unit in a plan view makes it possible to reduce the deterioration in image quality.

The line of sight of the user on the display image is detected from the captured image of the eyeball obtained by image capturing using infrared light. Any known technique can be applied as a method for detecting the light of sight using a captured image of an eyeball. For example, a line-of-sight detection method based on Purkinje images by reflection of irradiated light on corneas can be used.

More specifically, line-of-sight detection processing based on a pupil center corneal reflection method is performed. By using the pupil center corneal reflection method, a line-of-sight vector representing the direction (rotation angle) of an eyeball can be calculated based on the image of the pupil and the Purkinje image included in the captured image of the eyeball, thereby the line of sight of the user is detected.

The display device according to the present exemplary embodiment may include a photoelectric conversion device having a light-receiving element and may control a display image on the display device based on line-of-sight information about the user obtained from the photoelectric conversion device.

Specifically, in the display device, a first field-of-view region at which the user gazes and a second field-of-view region other than the first field-of-view region are determined based on the line-of-sight information. The first field-of-view region and the second field-of-view region may be determined by a control device for the display device. Alternatively, the first field-of-view region and the second field-of-view region determined by an external control device may be received. In a display region of the display device, the display resolution of the first field-of-view region may be controlled to be higher than the display resolution of the second field-of-view region. In other words, the resolution of the second field-of-view region may be set to be lower than the resolution of the first field-of-view region.

The display region includes a first display region and a second display region different from the first display region. One of the first display region and the second display region with a higher priority may be determined based on the line-of-sight information. The first display region and the second display region may be determined by the control device for the display device. Alternatively, the first display region and the second display region determined by an external control device may be received. The resolution of one of the regions with a higher priority may be controlled to be higher than the resolution of a region other than the region with the higher priority. In other words, the resolution of a region with a relatively low priority may be lowered.

In order to determine the first field-of-view region or the region with a higher priority, artificial intelligence (AI) may be used. The AI may be a model configured to estimate the angle of a line-of-sight from an eyeball image and a distance to a target object indicated by the line of sight by using the eyeball image and the actual direction of the eyeball image as teacher data. The display device, the photoelectric conversion device, or an external device may include an AI program. If the external device includes the AI program, the AI program is transmitted to the display device via communication.

In display control based on visual detection, it is suitable to apply smart glasses further including a photoelectric conversion device that captures an external image. The smart glasses can be configured to display captured external information in real time.

The disclosure is not limited to the above-described exemplary embodiments and can be modified in various ways.

For example, the exemplary embodiments of the disclosure also include an example where a part of the configuration according to any one of the exemplary embodiments is added to any of the other exemplary embodiments, and an example where a part of the configuration according to any of the exemplary embodiments is replaced with a part of the configuration according to any of the other exemplary embodiments.

The photoelectric conversion systems according to the sixth and seventh exemplary embodiments described above are examples of the photoelectric conversion system to which any of the photoelectric conversion devices according to the exemplary embodiments can be applied. The photoelectric conversion system to which any of the photoelectric conversion devices according to the exemplary embodiments can be applied is not limited to the configurations illustrated in FIGS. 16 to 20B. This also holds true for the distance image sensor according to the eighth exemplary embodiment, the endoscope according to the ninth exemplary embodiment, and the smart glasses according to the tenth exemplary embodiment.

The above-described exemplary embodiments are merely specific examples for carrying out the disclosure. The technical scope of the disclosure should not be interpreted in a limited way. That is, the disclosure can be carried out in various forms without departing from the technical idea or the main features thereof.

The disclosure is not limited to the above-described exemplary embodiments, and various alterations and modifications can be made without departing from the spirit and scope of the disclosure. Accordingly, the following claims are attached to publicize the scope of the disclosure.

According to an aspect of the embodiments, it is possible to provide a photoelectric conversion device capable of dealing with a phenomenon that occurs when a switch for controlling the voltage of the APD is turned off.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

The invention claimed is:

1. A photoelectric conversion device comprising:
an avalanche photodiode including a first terminal and a second terminal;
a first power supply connected to the first terminal;
a second power supply connected to the second terminal; and
a switch configured to switch a resistance value between the first power supply and the first terminal,
wherein the first terminal of the avalanche photodiode is connected to each of a gate of a first p-channel metal-oxide semiconductor (PMOS) transistor and a gate of a first n-channel MOS (NMOS) transistor, the first PMOS transistor and the first NMOS transistor being connected in series between a third power supply and a fourth power supply, and
wherein the photoelectric conversion device further comprises a first cut-off unit configured to cut off an electrical path between the third power supply and the fourth power supply, and in a case where the switch is controlled to a standby state, the first cut-off unit cuts off the electrical path.

2. The photoelectric conversion device according to claim 1,
wherein the switch is a metal-oxide semiconductor (MOS) transistor, and a gate of the switch is connected to a first control line, and
wherein the photoelectric conversion device controls a state where a voltage applied to the avalanche photodiode exceeds a breakdown voltage and a state where the voltage applied to the avalanche photodiode does not exceed the breakdown voltage.

3. The photoelectric conversion device according to claim 1,
wherein the switch is a MOS transistor, and a gate of the switch is connected to a first control line, and
wherein the photoelectric conversion device controls a standby state where avalanche multiplication by the avalanche photodiode is possible and a recharging state for returning to a state where the avalanche multiplication by the avalanche photodiode is possible.

4. The photoelectric conversion device according to claim 2, wherein the first cut-off unit is a MOS transistor, and a gate of the first cut-off unit is connected to a second control line, and wherein the electrical path is controlled between a conductive state and a non-conductive state by a second signal input from the second control line for the first cut-off unit.

5. The photoelectric conversion device according to claim 4, wherein the second signal is generated by a logical operation between a first signal input from the first control line and a third signal, and wherein the second signal controls the first cut-off unit.

6. The photoelectric conversion device according to claim 1, wherein the first PMOS transistor and the first NMOS transistor include a waveform shaping function for generating a pulse based on an output signal from the avalanche photodiode.

7. The photoelectric conversion device according to claim 1, wherein an output terminal of a logic circuit including the first cut-off unit is connected to a counter circuit.

8. The photoelectric conversion device according to claim 7, wherein the logic circuit includes a second PMOS transistor and a second NMOS transistor, wherein a source of the first PMOS transistor is connected to the third power supply, wherein a source of the first NMOS transistor is connected to the fourth power supply, wherein a drain of the first PMOS transistor and a source of the second PMOS transistor are connected, wherein a drain of the second PMOS transistor, a drain of the first NMOS transistor, and a drain of the second NMOS transistor are connected, and wherein the source of the first NMOS transistor and a source of the second NMOS transistor are connected.

9. The photoelectric conversion device according to claim 7, wherein the logic circuit includes a second PMOS transistor and a second NMOS transistor, wherein a source of the first PMOS transistor is connected to the third power supply, wherein a source of the first NMOS transistor is connected to the fourth power supply, wherein a drain of the first PMOS transistor, a drain of the second PMOS transistor, and a drain of the second NMOS transistor are connected, wherein the source of the first PMOS transistor and a source of the second PMOS transistor are connected, and wherein a drain of the first NMOS transistor and a source of the second NMOS transistor are connected.

10. The photoelectric conversion device according to claim 7, wherein the logic circuit includes a second PMOS transistor and a second NMOS transistor, wherein a source of the first PMOS transistor is connected to the third power supply, wherein a source of the first NMOS transistor is connected to the fourth power supply, wherein a source of the second PMOS transistor is connected to a drain of the first PMOS transistor, wherein a source of the second NMOS transistor is connected to a drain of the first NMOS transistor, and wherein a drain of the second PMOS transistor and a drain of the second NMOS transistor are connected.

11. The photoelectric conversion device according to claim 7, further comprising a second cut-off unit, wherein a first terminal of the second cut-off unit is connected to a node between the output terminal of the logic circuit and an input terminal of the counter circuit, and a second terminal of the second cut-off unit is connected to one of a power supply or a ground potential.

12. The photoelectric conversion device according to claim 1, wherein the avalanche photodiode outputs a photon detection signal based on detection of a photon during an exposure period.

13. The photoelectric conversion device according to claim 12, wherein the first cut-off unit controls the electrical path to a cut-off state during a period other than the exposure period.

14. The photoelectric conversion device according to claim 1, wherein the first power supply and the third power supply are configured to supply a common voltage.

15. A photoelectric conversion system comprising:

the photoelectric conversion device according to claim 1; and a signal processing unit configured to generate an image using a signal output from the photoelectric conversion device.

16. A moving body comprising:

the photoelectric conversion device according to claim 1; and a control unit configured to control traveling of the moving body using a signal output from the photoelectric conversion device.

\*  \*  \*  \*  \*